(12) United States Patent
Fertig et al.

(10) Patent No.: US 8,225,241 B2
(45) Date of Patent: Jul. 17, 2012

(54) METHOD AND APPARATUS FOR DESIGNING A DEVICE FOR ELECTRO-OPTICAL MODULATION OF LIGHT INCIDENT UPON THE DEVICE

(75) Inventors: Matthias Fertig, Altdorf (DE); Nikolaj Moll, Zurich (CH); Thomas E. Morf, Gross (CH); Thomas Pflueger, Leinfelden (DE)

(73) Assignee: International Business Machines Corporation, Armonk, NY (US)

( * ) Notice: Subject to any disclaimer, the term of this patent is extended or adjusted under 35 U.S.C. 154(b) by 884 days.

(21) Appl. No.: 12/267,820

(22) Filed: Nov. 10, 2008

(65) Prior Publication Data

US 2010/0122221 A1     May 13, 2010

(51) Int. Cl.
*G06F 17/50* (2006.01)
(52) U.S. Cl. ............................................. 716/55; 716/53
(58) Field of Classification Search ................ 716/51–55
See application file for complete search history.

(56) References Cited

U.S. PATENT DOCUMENTS

| 7,080,330 | B1 * | 7/2006 | Choo et al. ................... | 716/136 |
| 2009/0152664 | A1 * | 6/2009 | Klem et al. .................. | 257/440 |

OTHER PUBLICATIONS

Bhatnagar et al.; Receiverless detection schemes for optical clock distribution; Proceedings of the SPIE—The International Society for Optical Engineering; Jul. 6, 2004; vol. 5359, No. 1; pp. 352-359 (Quantum Sensing and Nanophotonic Devices, Jan. 25-29, 2004, San Jose, CA, USA).
Keeler et al.; Skew and Jitter Removal Using Short Optical Pulses for Optical Interconnection; IEEE Photonics Technology Letters, vol. 12, No. 6, Jun. 2000; pp. 714-716.

* cited by examiner

*Primary Examiner* — Nghia Doan
*Assistant Examiner* — Binh Tat
(74) *Attorney, Agent, or Firm* — Schmeiser, Olsen & Watts; Cynthia G. Neal

(57) ABSTRACT

A method and apparatus for designing a device to operate in a coupling mode, a detection mode, or a reflection mode for incident light. The incident light has a wavelength $\lambda$ and is incident upon a semiconductor structure of the device at an angle of incidence ($\theta_i$). A voltage (V) is applied to the device. Each mode may be designed for an ON state and/or OFF state. For the coupling mode and detection mode, the ON state and OFF state is characterized by high and low absorption of the incident light, respectively, by the semiconductor structure in conjunction with the applied voltage V and angle of incidence $\theta_i$. For the reflection mode, the OFF state and ON states is characterized by a shift in the optical path length of $\lambda/2$ and about zero, respectively, in conjunction with the applied voltage V and angle of incidences $\theta_i$.

25 Claims, 16 Drawing Sheets

DEVICE STRUCTURE FOR DETECTION MODE OR COUPLING MODE WITH PIN STRUCTURE

FIG. 9A LAYER CONFIGURATION FOR BASIC BUILDING BLOCK OF WAVEGUIDE AND GRATING

FIG. 9B DEVICE STRUCTURE WITH DESIGN PARAMETERS FOR WAVEGUIDE WITH PROPOGATING WAVE IN Y DIRECTION

DEVICE STRUCTURE AND ON-OFF SCENARIO FOR COUPLING AND DETECTION MODES

BASIC BUILDING BLOCK FOR GRATING WITH SWITCHING SCHEME

BASIC BUILDING BLOCK FOR GRATING WITHOUT SWITCHING SCHEME

METHOD AND APPARATUS FOR DESIGNING A DEVICE FOR ELECTRO-OPTICAL MODULATION OF LIGHT INCIDENT UPON THE DEVICE

FIELD OF THE INVENTION

The present invention relates to electro-optical modulation of light incident on a semiconductor structure.

BACKGROUND OF THE INVENTION

The usage of electric data interconnects becomes more and more difficult due to limitations of electrical signaling, resulting in the focus moving towards optics since the challenges that belong to silicon photonics will be compensated by the increasing design problems for the existing electrical solutions. Thus, more and more effort is taken to find monolithic optical solutions.

There is a need for a method and system for designing a semiconductor structure in a manner that takes advantage of interactions between the semiconductor structure and electromagnetic radiation that is incident upon the semiconductor structure.

SUMMARY OF THE INVENTION

The present invention provides a method for designing a device to operate in a coupling mode or a detection mode in which light having a wavelength $\lambda$ is incident upon a semiconductor structure comprised by the device at an incident angle ($\theta_i$) with respect to a direction opposite to a Z direction, said method comprising:

receiving input for designing the device to operate in the coupling mode or the detection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change $\Delta a$ of an absorption coefficient (a) and a change $\Delta n$ of an index of refraction of a semiconductor domain comprising each notch and its corresponding channel region to generate a changed absorption coefficient and a changed index of refraction of the semiconductor domain, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of $\lambda$, r, $h_g$, $\theta_{i,min}$, $\theta_{i,max}$, $V_{min}$, and $V_{max}$, an absorption coefficient threshold ($A_{th1}$), an index of refraction threshold ($n_{th1}$), acceptance criteria, and performance criteria;

ascertaining P solution sets at which the device operates in an ON state in which $V=V_1$ for causing the changed absorption coefficient to exceed $A_{th1}$ and causing the changed index of refraction to exceed $n_{th1}$ and at which the acceptance criteria are satisfied, wherein said ascertaining comprises calculating $\Delta a$ according to $\Delta a(V)$ and calculating $\Delta n$ according to $\Delta n(V)$, wherein $\Delta a(V)$ is a specified function of V and $\Delta n(V)$ is a specified function of V, wherein each solution set of the P solution sets comprises $p_1$, $w_1$, $\theta_i$, and $V_1$, and wherein $P \geq 1$;

if P=1 such that the P solution sets consist of a single solution set, then determining a design set for the ON state as being the single solution set;

if P>1, then computing a performance count with respect to the performance criteria for each solution set and determining the design set for the ON state as being a solution set of the P solution sets having the highest computed performance count;

transmitting the design set for the ON state to an output device.

The present invention provides an apparatus comprising a computer program product, said computer program product comprising a computer readable storage medium having a computer readable program code embodied therein, said computer readable program code containing instructions configured to be executed by a processor of a computer system to implement a method for designing a device to operate in a coupling mode or a detection mode in which light having a wavelength $\lambda$ is incident upon a semiconductor structure comprised by the device at an incident angle ($\theta_i$) with respect to a direction opposite to a Z direction, said method comprising:

receiving input for designing the device to operate in the coupling mode or the detection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change $\Delta a$ of an absorption coefficient (a) and a change $\Delta n$ of an index of refraction of a semiconductor domain comprising each notch and its corresponding channel region to generate a changed absorption coefficient and a changed index of refraction of the semiconductor domain, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of $\lambda$, r, $h_g$, $\theta_{i,min}$, $\theta_{i,max}$, $V_{min}$, and $V_{max}$, an absorption coefficient threshold ($A_{th1}$), an index of refraction threshold ($n_{th1}$), acceptance criteria, and performance criteria;

ascertaining P solution sets at which the device operates in an ON state in which $V=V_1$ for causing the changed absorption coefficient to exceed $A_{th1}$ and causing the changed index of refraction to exceed $n_{th1}$ and at which the acceptance criteria are satisfied, wherein said ascertaining comprises calculating $\Delta a$ according to $\Delta a(V)$ and calculating $\Delta n$ according to $\Delta n(V)$, wherein $\Delta a(V)$ is a specified function of V and $\Delta n(V)$ is a specified function of V, wherein each solution set of the P solution sets comprises $p_1$, $w_1$, $\theta_i$, and $V_1$, and wherein $P \geq 1$;

if P=1 such that the P solution sets consist of a single solution set, then determining a design set for the ON state as being the single solution set;

if P>1, then computing a performance count with respect to the performance criteria for each solution set and determining the design set for the ON state as being a solution set of the P solution sets having the highest computed performance count;

transmitting the design set for the ON state to an output device.

The present invention provides a method for designing a device to operate in a reflection mode in which light having a wavelength λ is incident upon a semiconductor structure comprised by the device at an incident angle ($\theta_i$) with respect to a direction opposite to a Z direction, said method comprising:

receiving input for designing the device to operate in the reflection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change Δa of an absorption coefficient and a change Δn of an index of refraction of a semiconductor domain comprising each notch and its corresponding channel region to generate a changed absorption coefficient (a), a changed index of refraction (n), and a change in an optical path length (ΔOPL) of the semiconductor domain, wherein ΔOPL=$(2\pi\lambda)*\Delta n*\delta r$, wherein δr is a total physical path length of the semiconductor domain traversed by the light incident upon the semiconductor structure at the angle $\theta_i$, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of λ, r, $h_g$, $\theta_{i,min}$, $\theta_{i,max}$, $V_{min}$, and $V_{max}$, an absorption coefficient threshold ($A_{th0}$), index of refraction thresholds ($n_{0min}$ and $n_{0max}$) such that $n_{0min} < n_{0max}$, acceptance criteria, and performance criteria;

ascertaining P solution sets at which the device operates in an OFF state in which V=$V_0$ for causing ΔOPL=λ/2 to be satisfied and causing the absorption coefficient of the semiconductor domain to be less than $A_{th0}$ and causing the index of refraction of the semiconductor domain to be in a range of $n_{0min}$ to $n_{0max}$ and at which the acceptance criteria are satisfied, wherein said ascertaining comprises calculating Δn according to Δn(V) and calculating δr via geometric ray tracing of the light through the semiconductor domain for the incident angle $\theta_i$, wherein Δn(V) is a specified function of V, wherein each solution set of the P solution sets comprises $p_1$, $w_1$, $\theta_i$, and $V_0$, and wherein P≧1;

if P=1 such that the P solution sets consist of a single solution set, then determining a design set for the OFF state as being the single solution set;

if P>1, then computing a performance count with respect to the performance criteria for each solution set and determining the design set for the OFF state as being a solution set of the P solution sets having the highest computed performance count;

transmitting the design set for the OFF state to an output device.

The present invention provides an apparatus comprising a computer program product, said computer program product comprising a computer readable storage medium having a computer readable program code embodied therein, said computer readable program code containing instructions configured to be executed by a processor of a computer system to implement a method for designing a device to operate in a reflection mode in which light having a wavelength λ is incident upon a semiconductor structure comprised by the device at an incident angle ($\theta_i$) with respect to a direction opposite to a Z direction, said method comprising:

receiving input for designing the device to operate in the reflection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change Δa of an absorption coefficient and a change Δn of an index of refraction of a semiconductor domain comprising each notch and its corresponding channel region to generate a changed absorption coefficient (a), a changed index of refraction (n), and a change in an optical path length (ΔOPL) of the semiconductor domain, wherein ΔOPL=$(2\pi\lambda)*\Delta n*\delta r$, wherein δr is a total physical path length of the semiconductor domain traversed by the light incident upon the semiconductor structure at the angle $\theta_i$, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of λ, r, $h_g$, $\theta_{i,min}$, $\theta_{i,max}$, $V_{min}$, and $V_{max}$, an absorption coefficient threshold ($A_{th0}$), index of refraction thresholds ($n_{0min}$ and $n_{0max}$) such that $n_{0min} \leq n_{0max}$, acceptance criteria, and performance criteria;

ascertaining P solution sets at which the device operates in an OFF state in which V=$V_0$ for causing ΔOPL=λ/2 to be satisfied and causing the absorption coefficient of the semiconductor domain to be less than $A_{th0}$ and causing the index of refraction of the semiconductor domain to be in a range of $n_{0min}$ to $n_{0max}$ and at which the acceptance criteria are satisfied, wherein said ascertaining comprises calculating Δn according to Δn(V) and calculating δr via geometric ray tracing of the light through the semiconductor domain for the incident angle $\theta_i$, wherein Δn(V) is a specified function of V, wherein each solution set of the P solution sets comprises $p_1$, $w_1$, $\theta_i$, and $V_0$, and wherein P≧1;

if P=1 such that the P solution sets consist of a single solution set, then determining a design set for the OFF state as being the single solution set;

if P>1, then computing a performance count with respect to the performance criteria for each solution set and determining the design set for the OFF state as being a solution set of the P solution sets having the highest computed performance count;

transmitting the design set for the OFF state to an output device.

The present invention advantageously provides a method and system for designing a semiconductor structure in a man-

DETAILED DESCRIPTION OF THE INVENTION

The present invention provides and utilizes an electro-optical modulator as a device that influences incident electromagnetic radiation (i.e., incident light) upon a medium by an electro-optical effect which changes the complex refractive index of the medium (i.e., the absorption and phase shift of the medium). The optical properties change in response to the magnitude of a voltage applied to the medium. The optical modulator of the present invention provides the capability of encoding information on an incident optical signal and using an optical logical gate that could be switched by an applied electrical signal. Such devices may be beneficially used for existing semiconductor applications by conforming the design of the devices to be compatible with existing semiconductor technologies.

The electro-optical modulator of the present invention can be fabricated in a complementary metal oxide semiconductor (CMOS) (e.g., a standard CMOS process). The electro-optical modulator of the present invention comprises a tunable refractive grating. In one embodiment, the incident light is a monochromatic beam of light (i.e., electromagnetic radiation) characterized by a wavelength $\lambda$. The incidence of the light is vertical or oblique to the grating. In one embodiment, the incident light is polychromatic.

Figure 1:
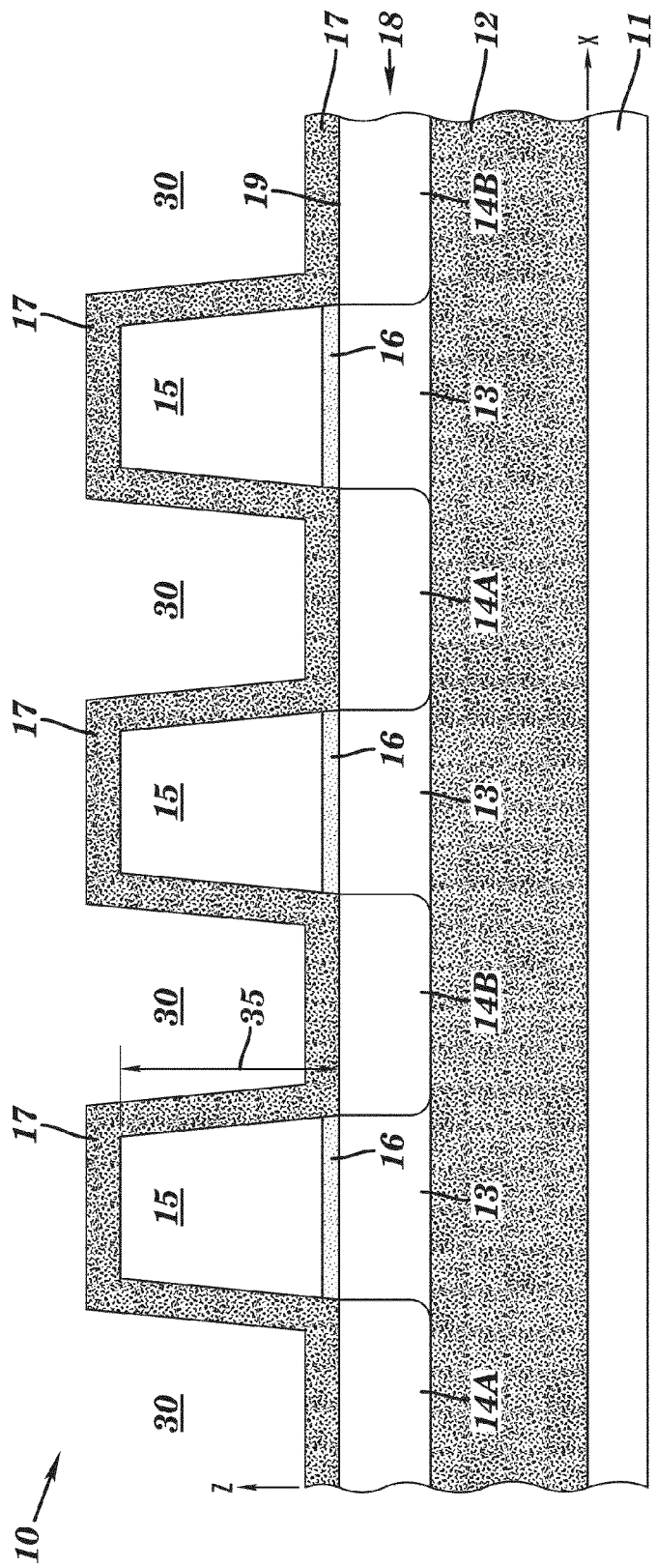
FIG. 1 depicts a device comprising a semiconductor structure that includes a refractive grating, in accordance with embodiments of the present invention.

FIG. 1 depicts a device comprising a semiconductor structure 10 that includes a refractive grating, in accordance with embodiments of the present invention. The semiconductor structure 10 comprises a semiconductor bulk semiconductor substrate 11, a buried oxide layer (BOX) 12 deposited on and in direct mechanical contact with the substrate 11, a semiconductor layer 18 on and in direct mechanical contact with the buried oxide layer 12 and comprising a channel regions 13 and doped semiconductor regions 14A and 14B, grating structures 35, and a passivation layer 17. Each grating structure 35 comprises a notch 15 and an insulator 16, wherein the notch 15 is insulatively separated from the respective channel regions 13 by the respective gate insulator 16. In one embodiment, the notch 15 is a gate electrode and the insulator 16 is a gate insulator. The passivation layer 17 covers and is in direct mechanical contact with the notches 15 and portions of the semiconductor layer 18. A medium 30 (e.g., glass) surrounds the semiconductor structure 10 and is in direct mechanical contact with the passivation layer 17.

FIG. 1 depicts an X-Z rectangular two-dimensional coordinate system having mutually orthogonal X and Z directions. The layers 11, 12, and 13 are oriented parallel to one another in the X direction and are stacked in the Z direction as shown.

The bulk semiconductor substrate 11 comprises a semiconductor material such as silicon. The buried oxide layer 12 comprises an electrically insulative material such as silicon dioxide. The channel regions 13 comprise a semiconductor material with low doping or without doping (e.g., silicon) unless a PIN diode structure is used as in FIG. 5 described infra. The doped semiconductor regions 14A and 14B comprise a doped semiconductor material (e.g., doped silicon). For example, doped semiconductor regions 14A and 14B comprise N+ (electron donor) and P+ (electron acceptor) doped semiconductor material, respectively. The notches of the grating 15 are spaced apart by a constant separation distance (pitch) $p_1$ (see FIG. 2) and comprise an electrically conductive material such as polysilicon. The insulators 16 comprise an electrically insulative material such as silicon dioxide or silicon nitride.

The passivation layer 17 comprises an electrically insulating material (e.g., silicon nitride) which may be formed by a process such as chemical vapor deposition (CVD) or plasma-enhanced chemical vapor deposition (PECVD). The passivation layer 17 may be used as an insulator layer to electrically isolate different structures, as a diffusion barrier against corrosive substances (e.g., water), etc.

Figure 2:
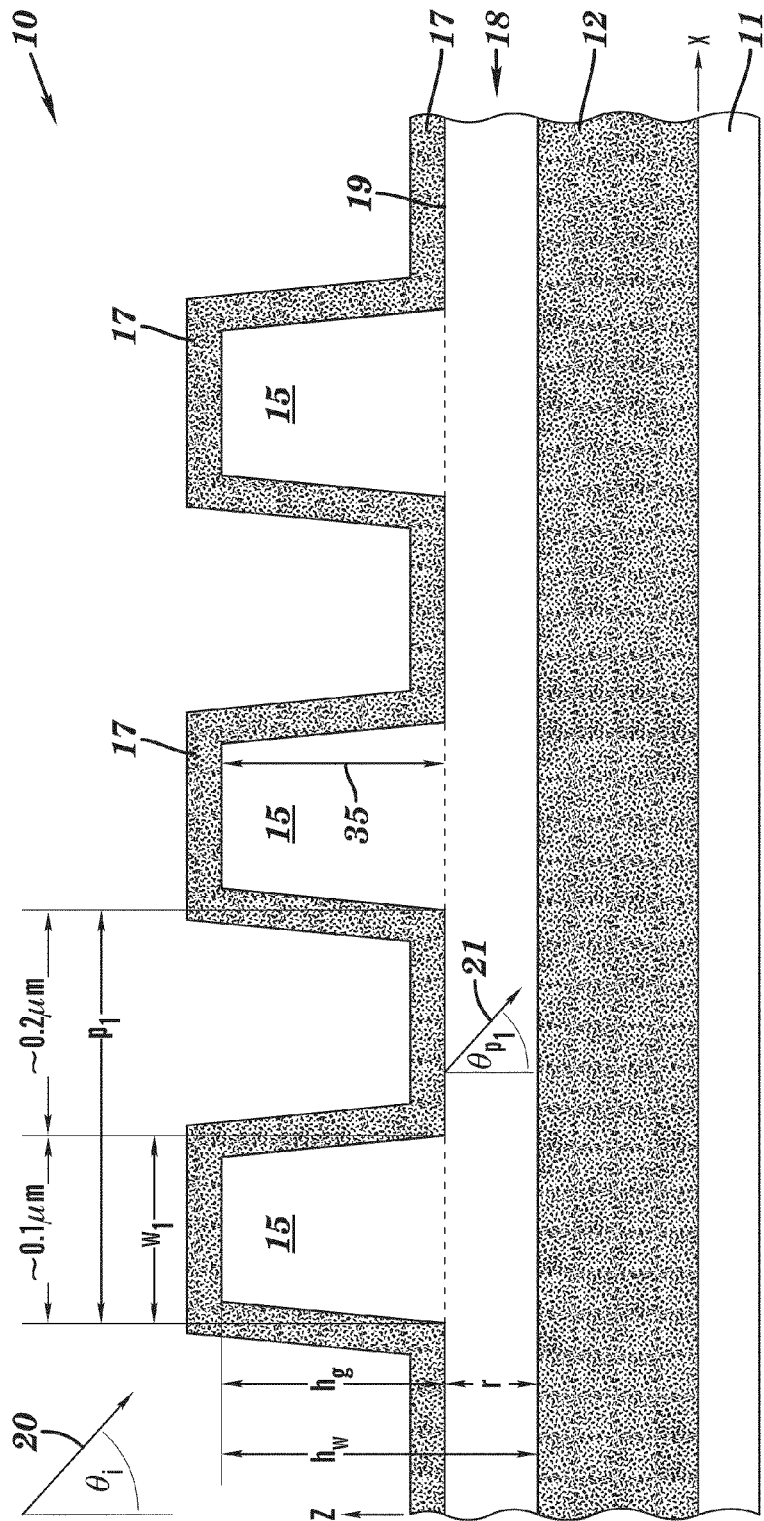
FIG. 2 shows geometric parameters of the semiconductor structure of FIG. 1, in accordance with embodiments of the present invention.

FIG. 2 shows geometric parameters of the semiconductor structure 10 of FIG. 1, in accordance with embodiments of the present invention. The structural details of the semiconductor layer 18 are omitted for simplicity in FIG. 2. For example, the semiconductor layer 18 may comprise a PIN structure in the detection mode as is explained infra in conjunction with FIG. 5. As another example, a PIN structure may be absent from the semiconductor layer 18 as in the coupling mode and the reflection mode. The insulator 16 has been omitted from FIG. 2 for simplicity but nonetheless exists in FIG. 2 as depicted in FIG. 1. Similarly, the insulator 16 has likewise been omitted from FIGS. 3, 5, 8, 9B, 10, and 11 for simplicity but nonetheless exists in FIGS. 3, 5, 8, 9B, 10, and 11 as depicted in FIG. 1.

FIG. 2 depicts a pitch ($p_1$) which denotes a separation distance between successive notches 15 in the X direction, a width ($w_1$) of each notch 15 in the X direction, and a height ($h_g$) in the Z direction of each notch 15 above the semiconductor layer 18 in the Z direction. The pitch ($p_1$) in the X direction in FIG. 2 is defined as the period of the periodic distribution of notches 15 in the X direction. The width $w_1$ and the pitch $p_1$ satisfy $0 < w_1 < p_1$. As shown in FIG. 2, the width ($w_1$) of the notch 15 is at a location where the notch is closest to the top surface 19 of the semiconductor layer 18.

Thus, the grating structures 35 are distributed in a periodic pattern having a pitch or period $p_1$ in the X direction. FIG. 2 shows exemplary values of ~0.1 micron and ~0.2 microns for $w_1$ and $p_1$, respectively. The channel region 13 (and semiconductor layer 18) has a thickness (r) in the direction Z. The height ($h_w$) in the Z direction of the notches 15 above the buried oxide layer 12 of each notch 15 is the sum of $h_g$ and r.

FIG. 2 also depicts an incident light 20 on the semiconductor structure 10 oriented at an angle of incidences with respect to the −Z direction and a resultant refracted light 21 in the semiconductor layer 18 that is oriented at an angle $\theta_{p1}$ with respect to the −Z direction for a wave component propagating in the X direction.

The layers of the semiconductor structure 10 in FIGS. 1 and 2 are configured in accordance with a refractive grating. The geometric parameters $p_1$, $w_1$, r, and $h_g$ are design parameters that may be selectively chosen to enable the electro-optical modulator device of the semiconductor structure 10 in FIGS. 1 and 2 to satisfy specified criteria, which may result in optimum performance of the device in one embodiment. In one embodiment, r and $h_g$ are input to a method that determines values $p_1$ and $w_1$ consistent with an ON or OFF state being operational for a coupling mode, a detection mode, and a reflection mode. The electro-optical modulator device of the present invention may be designed to operate in accordance with one or more of the three modes (i.e., the coupling mode, a detection mode, and a reflection mode). FIGS. 1 and 2 are applicable to all three modes.

In the coupling mode and the detection mode, the refraction grating is designed to provide evanescent coupling of the incident wave with the semiconductor structure 10. In one embodiment, the dimensions of the grating are in a sub-wavelength range. In one embodiment, the dimensions of the grating are designed for higher orders of the incident wavelength $\lambda$.

Since the coupling and detection mode using evanescent coupling and require a maximum concentration of irradiance in the channel regions 13 in the ON state (which will be described in detail infra), the coupling and detection modes may be combined within one single device in one embodiment.

The reflection mode is not characterized by evanescent coupling, but uses an optimized phase shift that results in an OPD (optical path difference) within the reflected wave, caused by the modulated grating to eliminate or not eliminate the reflected portion of the incident wave. The phase shift depends on the path of the propagation the incident radiation through the modulated grating and therefore on the physical dimensions of the grating in accordance with Equation 2, described infra. The reflection mode requires a maximum reflectance and a difference in the optical path length close to half the wavelength in the OFF state (which will be described in detail infra). Therefore a device that has been designed for the reflection mode may show unacceptable performance in the detection mode or the coupling mode. In one embodiment depending on the application and the surrounding hardware, some design tradeoffs may be acceptable to permit a design satisfying specified criteria in combinations of the three modes (i.e., the coupling, detection, and reflection modes).

Figure 9:
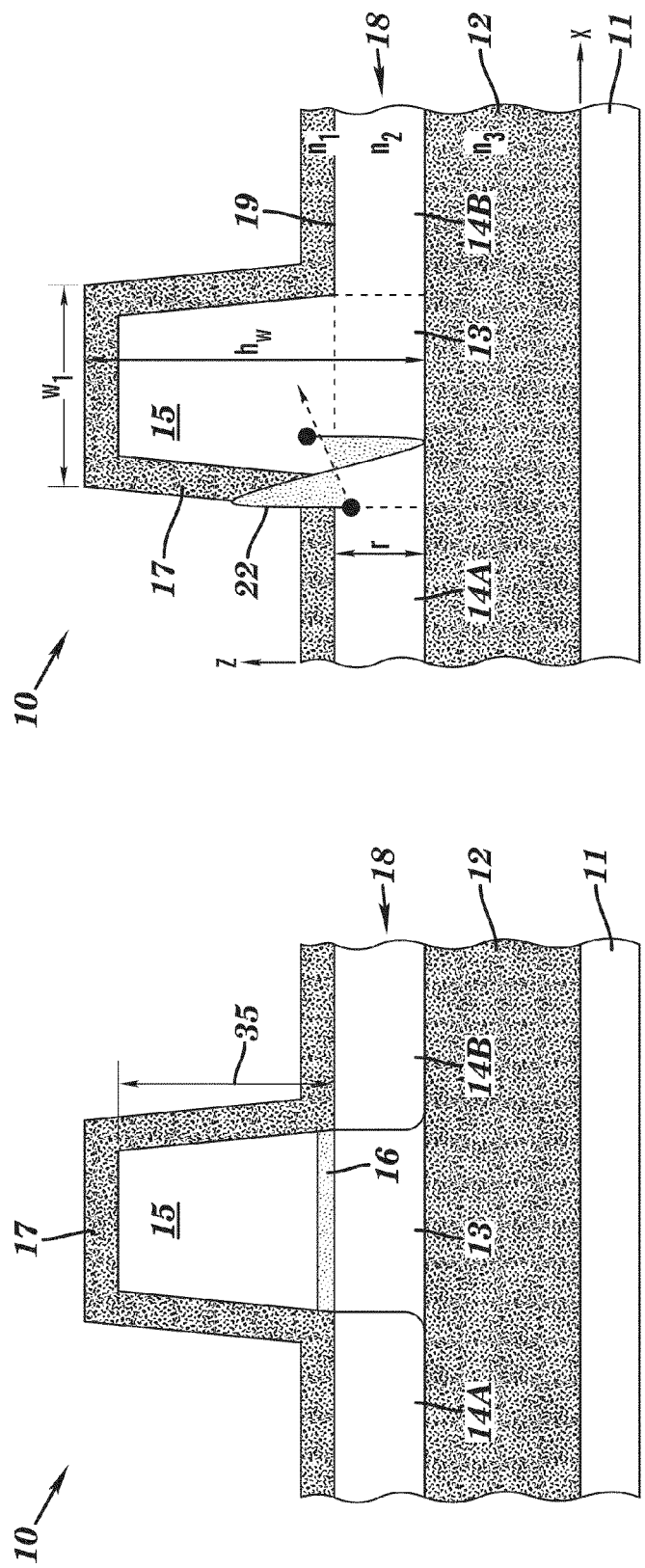
FIGS. 9A and 9B depict basic building blocks for a waveguide structure that could be attached to a device in a coupling mode or that could be an intrinsic waveguide and part of the device in coupling, detection, or reflection mode, in accordance with embodiments of the present invention.

FIGS. 9A and 9B (collectively, FIG. 9) depict basic building blocks for a waveguide structure that could be attached to or may be part of a device in a coupling mode or that could be an intrinsic waveguide and part of the device in coupling, detection, or reflection mode, in accordance with embodiments of the present invention. The waveguide contains a single grating/notch 15, the semiconductor layer 18, and the buried oxide layer 12 of FIG. 1 to distribute the coupled wave of the light, in accordance with embodiments of the present invention. FIG. 9A shows the structure that is derived from FIG. 1, containing the layer definitions. FIG. 9A also depicts a portion of the semiconductor structure 10 of FIG. 1 that includes just one of the notches 15.

FIG. 9B depicts the guidance of light propagating through a waveguide in the Y direction, wherein the extent of the guidance is measured by the rate of irradiance of amplitude 22 in the semiconductor layer 18. Layer 18 doesn't contain the PIN structure. The Y direction is orthogonal to the X and Z directions. FIG. 9B depicts the index of refraction ($n_1$) of the passivation layer 17, the index of refraction ($n_2$) of the semiconductor layer 18, and the index of refraction ($n_3$) of the buried oxide layer 12.

Figure 10:
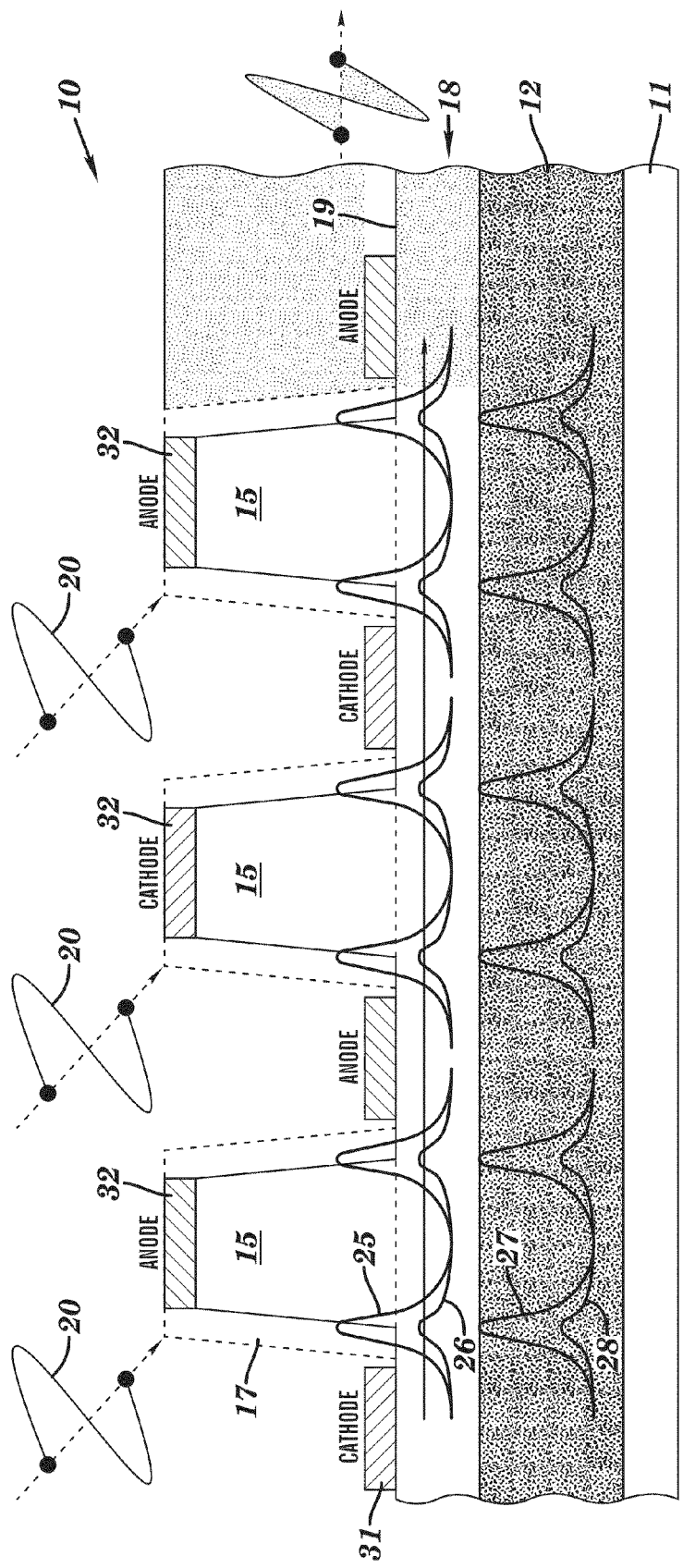
FIG. 10 depicts the semiconductor structure of FIG. 1 functioning in a switching scheme for the coupling mode and the detector mode, in accordance with embodiments of the present invention.

The coupling mode may include a waveguide structure after the coupling area as shown in FIG. 10 at the right end of the device. A waveguide requires an angle of incidence that causes 'total internal reflection' to function as a waveguide, which requires $n_1 < n_2$ and $n_3 < n_2$. In a symmetric waveguide, $n_1 = n_3$. In an asymmetric waveguide, $n_1 \neq n_3$. In one embodiment for a SOI process that is used for this device, $n_1$ and $n_3$ are about 1.4, and $n_2$ is about 4.5. The attachment of a waveguide to the grating is shown in FIG. 10 (described infra).

In the sequential steps for a waveguide, the manufacturing process introduces the available layer widths. The application uses a given wavelength. The wavelength is another tradeoff. The wavelength may be adapted to the material to provide the desired functionality with respect to the functional dependence of wavelength on attenuation. Choosing the wavelength and applying the layer thickness of r and $h_w$ introduces the width $w_1$ to get monomode characteristics in accordance with Equation (1A) as described infra. The present invention uses a one-dimensional or a two-dimensional grating for switchable coupling into the waveguide by applying a voltage to the grating.

Figure 3:
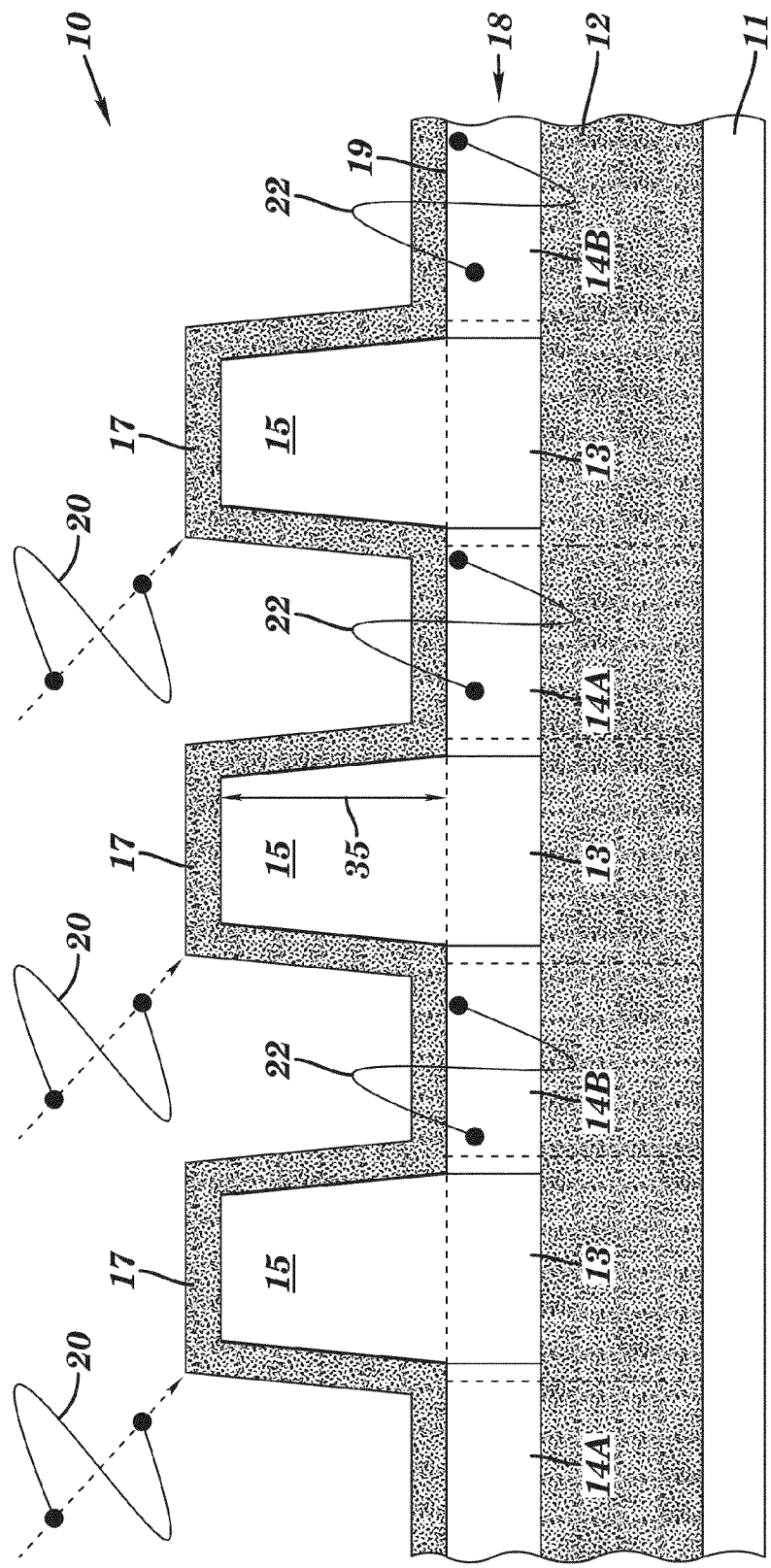
FIG. 3 depicts a refraction grating assembled by multiple notches for the coupling mode, in accordance with embodiments of the present invention.

FIG. 3 depicts a refraction grating assembled by multiple notches for the coupling mode, in accordance with embodiments of the present invention. FIG. 3 illustrates a high rate of irradiance (i.e. a large amplitude) from the incident light 20 on the semiconductor structure 10 at the angle $\theta_i$ as the light propagates in the channel 18 at the angle $\theta_{p1}$ (see FIG. 2 for $\theta_i$ and $\theta_{p1}$ illustrated) as depicted by the electromagnetic wave (EM-wave) 22 in the semiconductor layer 18.

Depending on the aspect ratio a/b (i.e., width/height ratio of the notches 15) as described in Equation (1A), the attached waveguide shows monomode characteristics, wherein $w_1$, $h_w$, and r are illustrated and defined in FIG. 2. Equation (1A) has evolved from empirical data $$w_1/h_w \leq r/(1-r^2)^{1/2} \tag{1A}$$

If $w_1/h_w$ and r satisfies Equation (1A), then the light is transmitted in the waveguide by monomode waveguide transmission; otherwise the light is transmitted in the waveguide by multimode waveguide transmission. Equation (1A) is a primary design criteria for a potentially attached waveguide or intrinsic waveguide.

The grating is tuned such that the incident light 20 will be coupled into the waveguide (ON state as illustrated by amplitude of the EM-wave 22 in the semiconductor layer 18 in FIG. 3) or will not be coupled into the waveguide (OFF state if the amplitude of the EM-wave 22 in the semiconductor layer 18 in FIG. 3 diminishes to zero or to a very low value). Since the design comprises sub-wavelength gratings, polarization effects are considered. The device could be optimized for TE- and TM-polarization by using 2-dimensional gratings.

Figure 4:
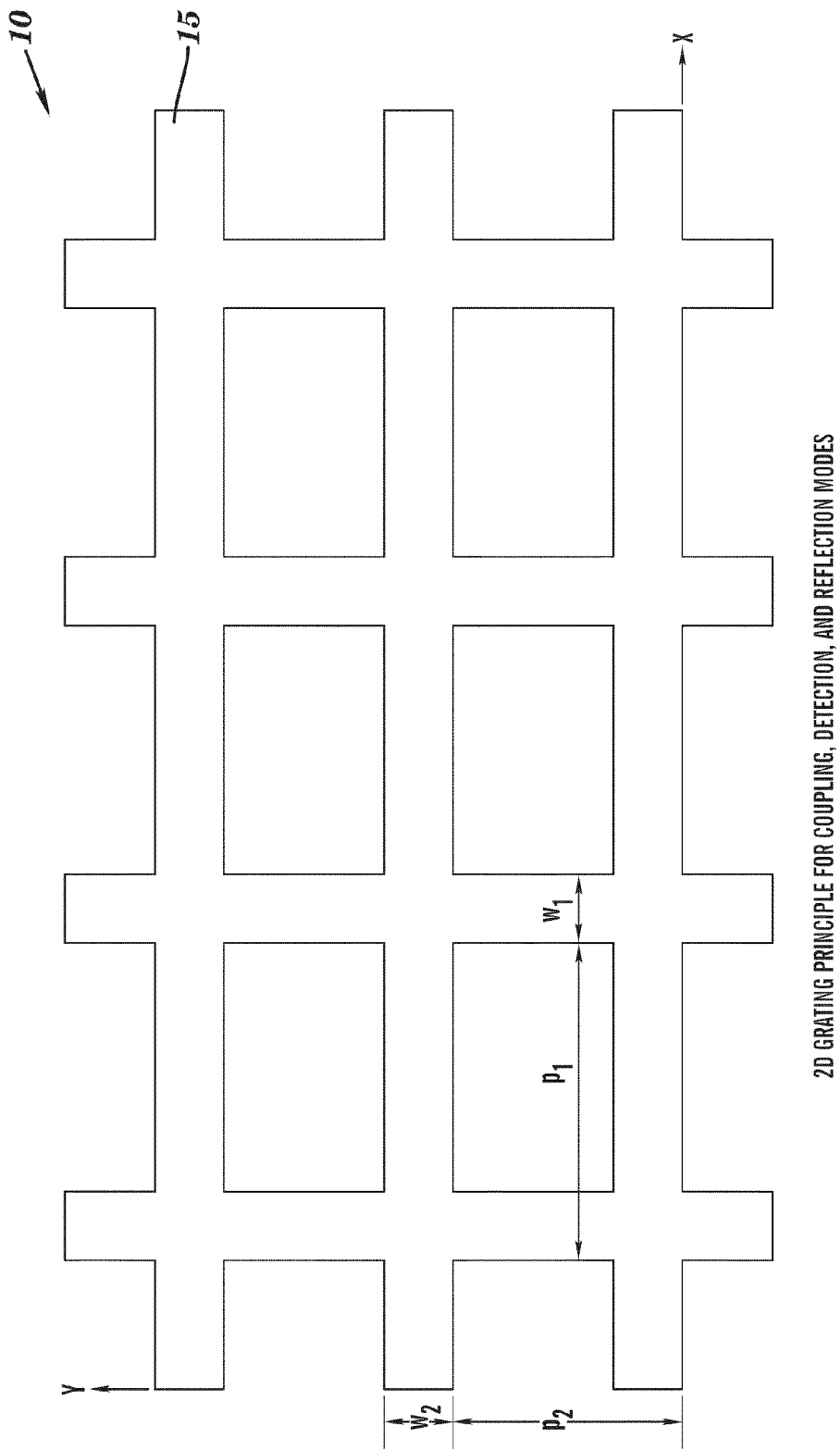
FIG. 4 depicts a top view of notches in a two-dimensional refractive grating for TE- and TM-polarization in the coupling or detection mode as an enhanced from the one-dimensional refractive grating structure of FIGS. 1 and 2, in accordance with embodiments of the present invention.

FIG. 4 depicts a top view of the notches 15 in a two-dimensional (2D) refractive grating for TE- and TM-polarization in the coupling, detection, or reflection mode as enhanced from the one-dimensional refractive grating structure of the semiconductor structure 10 of FIGS. 1 and 2, in accordance with embodiments of the present invention. The X and Y directions are mutually orthogonal and are each orthogonal to the Z direction of FIG. 1. Thus, (X, Y, Z) form a rectangular coordinate system in 3 dimensions. The dimensions $p_1$ and $w_1$ in the X direction in the two-dimensional grating of FIG. 4 respectively are the same as $p_1$ and $w_1$ in the X direction in the one-dimensional grating of FIG. 2. The dimensions $p_2$ and $w_2$ in the two-dimensional grating of FIG. 4 are the pitch (i.e., period) and width of the notch 15 (or grating structure 35—see FIG. 1), respectively, in the Y direction. The pitch ($p_2$) in the Y direction in FIG. 4 is defined as the period of the periodic distribution of notches 15 in the Y direction. The width $w_2$ and the pitch $p_2$ satisfy $0 < w_2 < p_2$. In one embodiment, $p_1 = p_2$ and $w_1 = w_2$. In one embodiment, $p_1 \neq p_2$ and $w_1 = w_2$. In one embodiment, $p_1 = p_2$ and $w_1 \neq w_2$. In one embodiment, $p_1 \neq p_2$ and $w_1 \neq w_2$.

For the two dimensional grating of FIG. 4 in the coupling mode, the resulting waveguide will have monomode characteristics if Equations (1A) and (1B) are satisfied.

$$w_2/h_w \leq r/(1-r^2)^{1/2} \tag{1B}$$

For both the one-dimensional grating of FIG. 2 and the two-dimensional grating of FIG. 4, the height ($h_g$) of each notch 15 above the semiconductor layer 18 in the Z direction is set to a specified input value as determined from design rules or other constraints, or provides an extra degree of freedom by being computed in the design process described herein. For the 2D refractive grating, Equations (1A) and (1B) are primary design criteria for a potentially attached waveguide or a potentially intrinsic waveguide.

Figure 5:
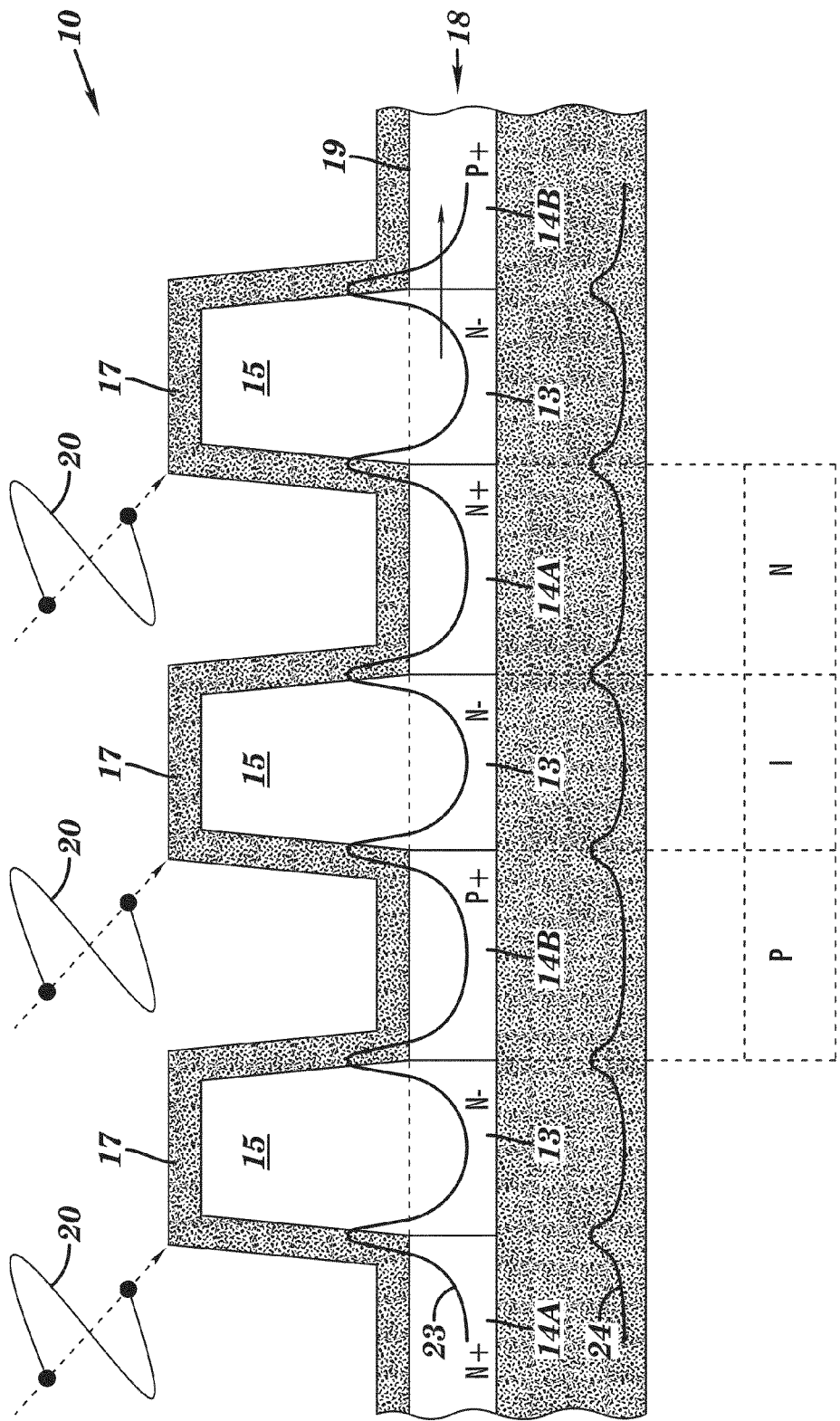
FIG. 5 depicts, for the detection mode or coupling mode w/PIN structure, an absorption of energy of light, concentrated by a grating structure, formed by a periodic series of notches and a PIN diode structure in the semiconductor layer of FIG. 1, in accordance with embodiments of the present invention.

FIG. 5 depicts, for the detection mode or coupling mode with a PIN structure, an absorption of light, concentrated by a grating structure, formed by a periodic series of notches 15 and a PIN diode structure in the semiconductor layer 18 of FIG. 1, in accordance with embodiments of the present invention. A PIN structure comprises a lightly doped 'near' intrinsic semiconductor region (I) between a heavily doped P-type semiconductor region (P) and a heavily doped N-type semiconductor region (N). In contrast with the detection mode, the device in the coupling mode does not comprise a PIN structure. The PIN structure is necessary required for the detection mode and is not necessary for the coupling and reflection modes.

The PIN structure in FIG. 5 is denoted by the characters P, I, N in association with P+, N− (or P− intrinsic region), and N+ doped semiconductor regions, respectively, in the semiconductor layer 18. N doped material comprises electrons and P doped material comprises holes instead of electrons. The symbols + and − after P and/or N refers to the amount of doping, wherein + denotes high doping and − denotes low doping.

FIG. 5 illustrates the absorption of energy from the incident light 20 as the light concentrates in the channel of semiconductor layer 18. In particular, FIG. 5 depicts a high absorption amplitude 23 in the semiconductor layer 18 and a low absorption amplitude 24 in the buried oxide layer 12.

The tunable grating in the semiconductor structure 10 causes intensity maxima of the light in the PIN structure.

For the ON state in the detection mode, the tuned grating would cause a detection of light from the high amplitude 23 in the semiconductor layer 18. For the OFF state in the detection mode, the tuned grating causes a low amplitude and the device would result in no detection of light from an absence of detection of the high absorption amplitude 23 in the semiconductor layer 18.

For the ON state in the detection mode, the grating provides high irradiance in the area of depletion and the diffusion voltage across the depletion zone avoids an immediate recombination of generated charge/hole pairs. A photo current is generated. The photo current is a flow of charges to the contacts that forms an electrical signal. The concentration of the irradiance depends on the grating efficiency and the grating efficiency depends on the refractive index of the grating, the concentration of optical power could be shifted by applying a change in the refractive index in accordance with FIG. 10.

In the detection mode, the semiconductor structure 10 does not work like an conventional electro-optical modulator, because the energy is absorbed and an electrical output is generated, resulting from application of a voltage to the semiconductor structure 10.

FIG. 10 depicts the semiconductor structure of FIG. 1 functioning in a switching scheme for the coupling mode and the detector mode, in accordance with embodiments of the present invention. For the incident light 20, FIG. 10 depicts: a high absorption amplitude 25 in the semiconductor layer 18, a low amplitude 26 in the semiconductor layer 18 (ON-case), a high absorption amplitude 27 in the buried oxide layer 12, and a low absorption amplitude 28 in the buried oxide layer 12 (OFF-case).

FIG. 10 also depicts electrically conductive terminals, namely cathodes 31 and anodes 32, distributed on a top surface of the doped semiconductors 14 (see FIG. 1) and the notches 15. A voltage may be applied between an anode 32 and a respective cathode 31 for each notch 15.

Figure 7:
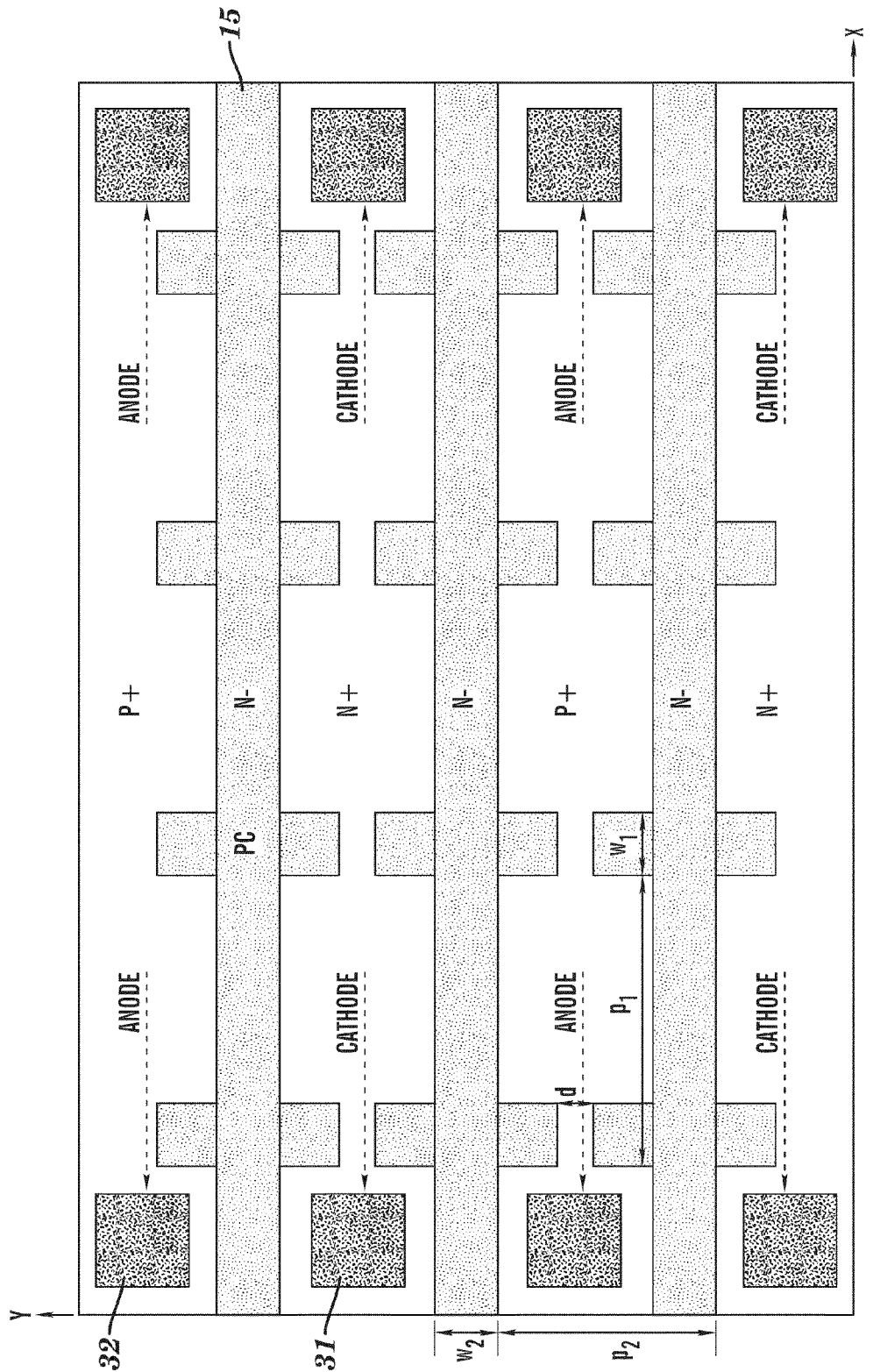
FIG. 7 shows a top view of 2-dimensional refractive grating of notches for detecting for TE- and TM-polarization for a device in the detection mode, in accordance with embodiments of the present invention.

FIG. 7 shows a top view of 2-dimensional (2D) refractive grating of notches 15 for detecting for TE- and TM-polarization for a device in the detection mode, in accordance with embodiments of the present invention. The 2D refractive grating is optimized for a standard semiconductor process for a device in the detection mode.

The notches 15 are periodic in both the X and Y directions, wherein $p_1$ and $w_1$ respectively denote the pitch (i.e., period) and width of the notches 15 in the X direction, and wherein $p_2$ and $w_2$ respectively denote the pitch (i.e., period) and width of the notches 15 in the Y direction In FIG. 7, the indicated N+, N−, and P+ regions are located underneath the notches 15 similar to what is shown in FIG. 5 described supra. The gap (d) in the Y direction is necessary for the evolution of the PIN structures in a standard CMOS technology and the required contacting to collect a photocurrent. The reason for the gap (of dimension d) is that no intrinsic area should be formed in vertical direction. In that case, every PIN area needs to be contacted separately. Providing the gaps reduces the contacting to both sides of the detecting-area of the device. The minimum distance d is determined by manufacturing (i.e. lithography). The maximum distance d is determined by the required pitches and grating widths. In general a minimum distance is wanted to provide a maximum efficiency of the related grating.

The different doping in the PIN structure causes a diffusion current; i.e., a flow of electrons and holes to the other material when attached to each other. This causes the intrinsic region that has a low carrier concentration and is affected by the diffusion voltage to separate electrons that are elevated into the conduction band when excited by incident photons of the incident light 20 in accordance with the photo-electric effect.

The intrinsic region (I) aligns vertical below the edge of the semiconductor layer 18 where the edges of the gate insulator 14 are in contact with channel region 13. The insulator 16 is used as an isolation between the notch 15 and the channel region 13, which in a CMOS-FET (complementary metal oxide semiconductor-field effect transistor) avoids conducting the photo current from the channel region 13 to an attached conductive contact via the notch 15. If the insulator 16 is a degree of freedom (i.e., a free parameter to be determined) in the design of the grating, the insulator 16 would be chosen such that there is sufficient influence of the applied voltage of the notch on the grating 15 and the channel region 13, but no leakage or tunneling currents through the notch 15.

The applied voltage (V) causes a change in the intrinsic region (i.e., the depletion region of the PIN-structure). Depending on the applied voltage, the intrinsic region will grow or shrink and thus will further influence the detection of the light in the semiconductor layer 18. The applied voltage in the detection mode has a first effect and a second effect. The first effect is to shift the grating efficiency which shifts the maximum irradiance. The second effect is to change the width of the intrinsic region in the diode. This intrinsic, depleted region is sensitive to incident photons. This capability is controlled by the doping concentration in the material which may be specified for the silicon on insulator (SOI) semiconductor process. If the doping concentration could be chosen, a low doping concentration may be chosen in one embodiment to avoid a small depletion region and thereby avoid high capacitances within the device to reduce the RC time constant (i.e., switching delay caused by resistance and capacitance).

An application of the present invention in the detection mode is the clock-gating of an optical clock signal. The high frequency gratings show sensitivity to the incident mode and low frequency gratings are insensitive to the incident mode. If the channel regions are sufficiently small (e.g. in the nanometer range), a small shift in the concentration of electrons and holes is sufficient to turn 'off' the optical signal, which makes sense for gating an optical clock.

Figure 6:
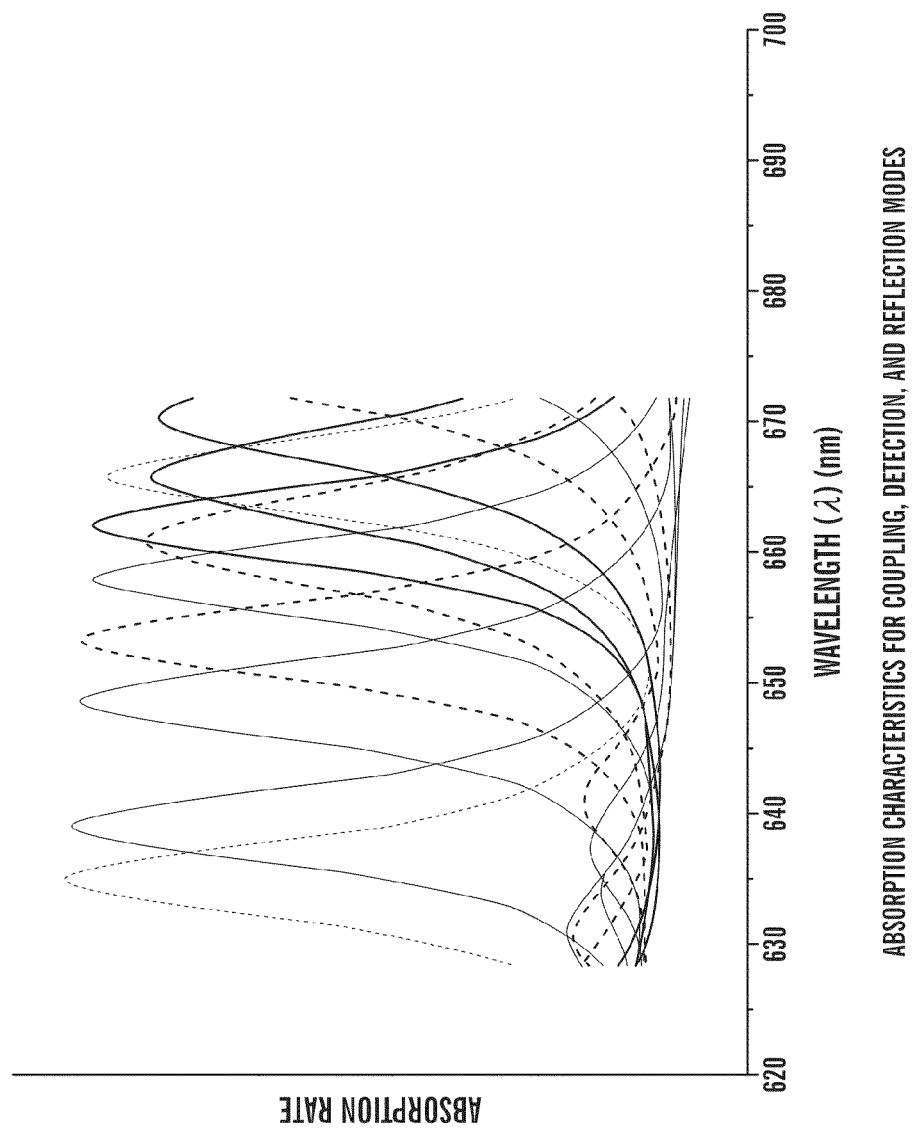
FIG. 6 depicts a simulated energy absorption rate versus wavelength for vertical incidence of the incident light onto a semiconductor structure for the detection and coupling modes, in accordance with embodiments of the present invention.

FIG. 6 depicts a simulated energy absorption rate versus wavelength ($\lambda$) for vertical incidence (i.e., incidence in the −Z direction in FIG. 1 characterized by $\theta_i=0$) of the incident light 20 onto the semiconductor structure 10 for the detection and coupling modes (see FIG. 10), in accordance with embodiments of the present invention. The simulations resulting in FIG. 6 were performed for an exemplary standard CMOS SOI or bulk technology. The absorption rate is the amount of energy per unit time that is absorbed from the incident light by a semiconductor domain consisting of a notch 15 and its corresponding channel region 13. The energy absorption rate is a measure of a coupling efficiency for the coupling of the incident light 20 to the semiconductor structure 10. Each curve of FIG. 6 represents a different pitch ($p_1$) and a constant value of maximum notch width ($w_1$) and a constant value of the height ($h_g$) of the notches 15 (see FIG. 2). However, $w_1$ and/or $h_g$ may be varied in some embodiments.

FIG. 6 shows that the absorption rate is very selective to the wavelength $\lambda$ and that the resonance peak scales with the wavelength $\lambda$ and the pitch $p_1$, as well as the pitch $p_2$ for the two-dimensional refractive grating depicted in FIG. 4 (coupling mode) and FIG. 7 (detection mode). Thus, the refractive grating can produce a sharp channel separation within just a few nanometers of incident light.

The gratings provide a high channel separation as shown in FIG. 6, which makes it possible to: detect a certain wavelength by optimizing the grating for the desired wavelength (e.g., WDM-capability, Wavelength Division Multiplexing); selecting between wavelengths in the detection mode by applying a voltage to the grating and thereby jumping from one peak to another; coupling a certain wavelength by optimizing the grating for the desired wavelength, and modulate a desired wavelength.

Figure 8:
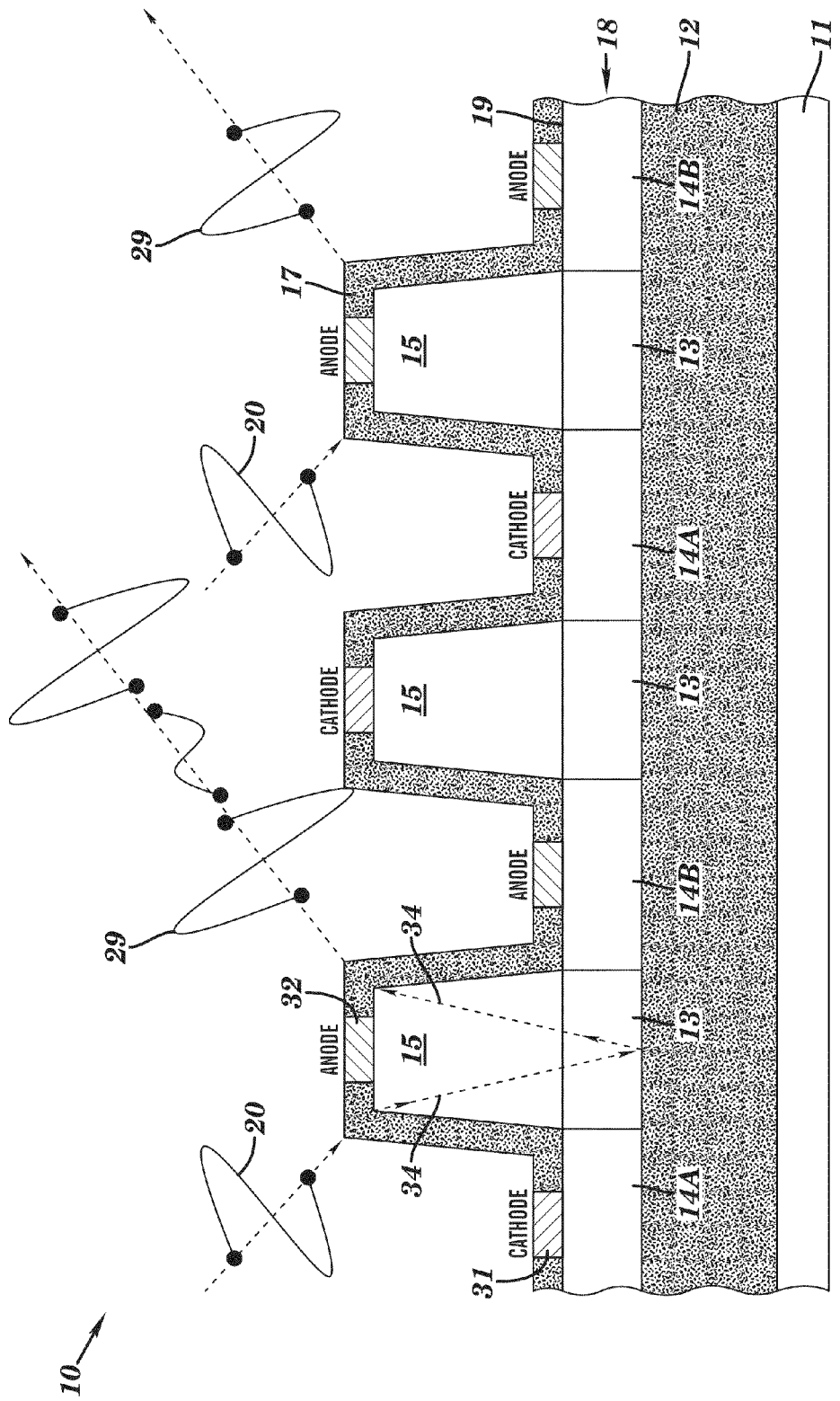
FIG. 8 illustrates incident light being reflected by a semiconductor structure in the reflection mode, in accordance with embodiments of the present invention.

FIG. 8 illustrates incident light 20 being reflected by the semiconductor structure 10 in the reflection mode, in accordance with embodiments of the present invention. The reflected light 22 propagates away from the semiconductor structure 10 as shown. A voltage (V) may be applied between an anode 32 and a respective cathode 31 for each notch 15.

In the reflection mode, the tunable grating will modulate ("emboss") information on the reflected portion of light. Any reflection of light depends on the refractive index as described in the Fresnel formulas for reflection coefficient. The change in the refractive index will be used to modulate the reflected light. The reflection mode is of high interest for optical communications, because there's no need for an on-chip laser to send an optical signal. The reflected wave will be eliminated or not by a superposition of the shifted and non-shifted reflected waves. The shift in the optical path (i.e. the optical path difference OPD) is induced by a change $\Delta$OPL in the optical path length (OPL) as described in Equation (2).

$$OPD = \Delta OPL = (2\pi\lambda) * \Delta n * \delta r \qquad (2)$$

wherein $\Delta n$ denotes a change of an index of refraction (n) of a semiconductor domain consisting of each notch 15 and its corresponding channel region 13, wherein a traversed path 34 of the light 20 though the semiconductor domain is the path of the light 20 through the semiconductor domain from a spatial point of incidence upon the semiconductor structure 10 to a spatial point of exit as reflected light 29 from the semiconductor structure 10, as depicted in FIG. 8. The parameter $\delta r$ denotes the physical path length of the traversed path 34 of the light 20 through the semiconductor domain (i.e., through each notch 15 and its corresponding channel region 13).

The optical path length (OPL) over a physical path of $N_R$ regions denoted as regions $1, 2, \ldots, N_R$ traversed by the light is formally defined herein as $OPL=(2\pi\lambda)\Sigma_i n_i \delta r_i$, wherein $n_i$ denotes the index of refraction in region i, $\delta r_i$ denotes the physical path length in region i, and $\Sigma_i$ denotes a summation from i=1 to i=$N_R$.

A shift in the OPL of half the incident wavelength (i.e., $\Delta OPL=\lambda/2$) causes a complete elimination of the reflected wave 29. This elimination will be modulated by the applied voltage as shown in FIG. 8 and characterizes the OFF state for the device in reflection mode.

In the ON state, OPD~0 is satisfied so that there is no cancellation in the incident and reflected waves of light. In the ON state, OPD~$\lambda/2$ is satisfied so that there is cancellation in the incident and reflected wave.

The change in carrier concentration (i.e., in electron concentration $N_e$ and hole concentration $N_h$) enables calculation of the change in the refractive index as described infra in conjunction with Equations (3A) and (3B). The change of carrier concentration may be triggered by an applied voltage that causes a change in the electron and hole density depending on the semiconductor and the concentration of the dopant.

In one embodiment for the reflection mode, the semiconductor layer 18 contains no PIN structure. In one embodiment for the reflection mode, the semiconductor layer 18 comprises the PIN diode structure depicted in FIG. 5.

Figure 11B:
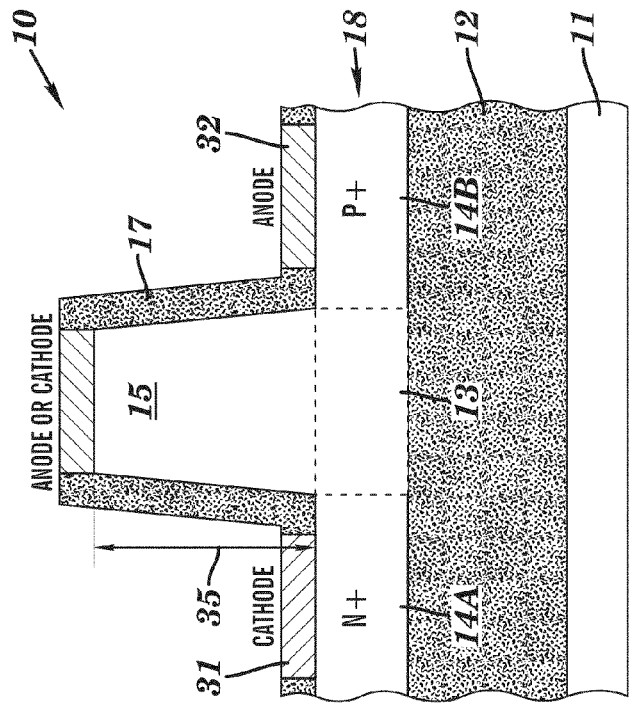
FIG. 11B depicts the basic building block for a switchable notch as used in the coupling mode, detection mode, or reflection mode, in accordance with embodiments of the present invention.
Figure 11A:
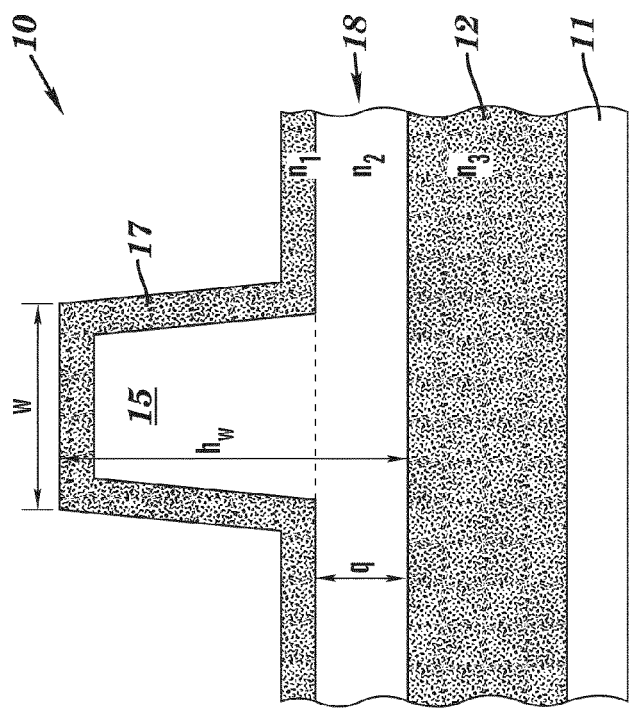
FIG. 11A depicts the basic building blocks for a non-switchable notch, in accordance with embodiments of the present invention.

The device may be operated in two dimensions in the reflection mode in accordance with the two-dimensional geometry depicted in FIG. 4 in which the notches 15 are periodic in both the X and Y directions, wherein $p_1$ and $w_1$ respectively denote the period (i.e., pitch) and width of the notches 15 in the X direction, and wherein $p_2$ and $w_2$ respectively denote the period (i.e., pitch) and width of the notches 15 in the Y direction FIG. 11A depicts the basic building blocks for a non-switchable notch, in accordance with embodiments of the present invention. FIG. 11A does not include a PIN structure and does not include electrodes. FIG. 11A includes the basic building blocks for a device of arbitrary size in one of the operation modes. FIG. 11A depicts the index of refraction ($n_1$) of the passivation layer 17, the index of refraction ($n_2$) of the semiconductor layer 18, and the index of refraction ($n_3$) of the buried oxide layer 12, wherein $n_2 > n_1$ and $n_2 > n_3$ to provide total internal reflection within the channel of the semiconductor layer 18.

FIG. 11B depicts the basic building block for a switchable notch as used in the coupling mode, detection mode or reflection mode, in accordance with embodiments of the present invention. A voltage drop (V) may be applied between an anode 32 and a respective cathode 31 for the notch 15 to cause a change in the refractive index and cause a manipulation of light as described before. A device could be assembled from these basic building blocks with arbitrary size.

The modulation of the grating is induced by an applied voltage as shown in FIG. 11 in all modes (coupling, detecting, reflecting). The device provides an anode contact 32 and a cathode contact 31, and the applied voltage influences the optical properties (i.e. by changing the charge distribution) of the notch 15 and channel region 13 by introducing a change in the complex refractive index. The cathode 31 and the anode 32 are electrically conductive conducts that may include metal, silicide, etc. Finally the coupling, resonance and reflection characteristic of the entire grating is tuned and the path of light is manipulated by the change in the reflective and transmissive capabilities of the semiconductor material.

Equation (3A) describes the change $\Delta a$ in the absorption coefficient as a function of a change ($\Delta N_e(V)$) in the electron charge density $N_e(V)$ and a change ($\Delta N_h(V)$) in the hole density $N_h(V)$ induced by the applied voltage V.

$$\Delta a = ((e^3 \lambda_0^2)/(4\pi^2 c^3 \epsilon_0 n))*(\Delta N_e(V)/(\mu_e m_{ce}^2) + \Delta N_h(V)/(\mu_h m_{ch}^2)) \quad (3A)$$

Equation (3B) describes the change $\Delta n$ of the real part of the refractive index n in the traversed path of the light 20 through the semiconductor structure 10 as described supra in conjunction with Equation (2).

$$\Delta n = ((-e^3 \lambda_0^2)/(8\pi^2 c^2 \epsilon_0 n))*(\Delta N_e(V)/m_{ce} + \Delta N_h(V)/m_{ch}) \quad (3B)$$

In Equations (3A) and (3B), e is the electronic charge (e.g., in coulombs), $\lambda_0$ is the free-space wavelength, c is the velocity of light in a vacuum, $\epsilon_0$ is the permittivity of free space, $\mu_e$ is the electron mobility, $\mu_h$ is the hole mobility, $m_{ce}$ is the effective mass of an electron, and $m_{ch}$ is the effective mass of a hole.

The absorption coefficient (a) of the semiconductor domain is influenced by the imaginary part of the refractive index defined such that the energy density (i.e., energy per unit volume) of the light 20 in the semiconductor domain decreases to 1/e (e=2.71828) of its value as the light propagates a distance 1/a in the semiconductor domain, for an exponential decay (with respect to distance) of the energy density of the light 20 in the semiconductor domain as the light 20 propagates in the semiconductor domain. Given $\Delta a$ computed from Equation (3A), the change in the absorption coefficient ($\Delta a$) may be computed as a function of wavelength $\lambda$ and pitch ($p_1$ and/or $p_2$) (and other parameters) to yield functional dependencies and associated curves analogous to the curves of absorption rate plotted in FIG. 6. Such functional dependencies and curves may be used to compute values of the changed absorption coefficient ($\Delta a$) for a given wavelength $\lambda$ and pitch ($p_1$ and/or $p_2$) and other parameters (e.g., applied voltage V and angle of incidence $\theta_i$).

As shown in Equations (3A) and (3B), the change in the imaginary and real part of the refractive index, respectively, is related to the change in charge and hole concentration. This change in concentration could be controlled by an external voltage. In one embodiment, $\Delta N_e$ and $\Delta N_h$ may be computed in accordance with an applied voltage V via Equations (3C) and (3D), respectively.

$$\Delta N_e(V) = N_{e0}(\exp(\beta V) - 1)) \quad (3C)$$

$$\Delta N_h(V) = N_{h0}(\exp(\beta V) - 1)) \quad (3D)$$

where $\beta = q/(kT)$
q=electron charge ($1.60 \times 10^{-19}$ coulombs)
T=absolute temperature (deg K)
k=Boltzmann constant ($1.3807 \times 10^{-23}$ Joules/deg K)
V=input voltage to the grating (volts)
$N_{e0}$=electron concentration in semiconductor at V=0 (electrons/cm$^3$)
$N_{h0}$=hole concentration in semiconductor at V=0 (holes/cm$^3$)

Equations (3C) and (3D) are specific to one embodiment and other equations or algorithms determining $\Delta N_e(V)$ and $\Delta N_h(V)$ as a function of V are within the scope of the present invention and generally depend on the semiconductor material, dopant material, and dopant concentration.

Optimizing the optical path difference (OPD) for a given wavelength and a given angle of incidences may be performed by adjusting applied voltage and the dimensions of the grating (e.g., $w_1$, $p_1$, $w_2$, $p_2$, d, and $h_w$ for a two-dimensional grating). An application determines a subset of parameters and the given equations and the required performance of the design determines the solution for the other metrics. The application implements the design process that uses optical and electrical simulation, semiconductor design, and design rule checking. All layers may part of a SOI semiconductor or bulk process and provide the required accuracy (e.g., in the order of tenths of nanometers).

The voltage that is applied to adjust the complex index of refraction must not be so large that the voltage burns or otherwise damages the device (e.g., blows the PIN-diode in the detection mode), but is of such a magnitude to introduce a change in the refractive index that is large enough to generate the required phase shift in the reflection mode (i.e., half the wavelength) or the required intensity shift in the coupling mode or detection mode. The magnitude of the applied voltage depends on the physical dimensions and the doping/carrier concentrations ($N_e$ and $N_p$). The resulting shift in the complex refractive index determines if the grating has the correct pitch/width to provide the required path length for the traversing light to generate the required phase shift at a given angular of incidence in the reflection mode, or the required intensity shift at a given angle of incidence in the coupling mode or detection mode. In one embodiment, the layer thicknesses (i.e., $h_w$ and $h_g$) are fixed and cannot be changed, wherein the pitch $p_1$ and width $w_1$ are 'free' design parameters, wherein 'free' means free within the margins of the design rules (e.g., design rules determined by lithography and its accuracy).

All operation modes may benefit from an optimization of the design parameters that are shown in FIGS. 2 to 7.

Simulations have shown that the angle of incidence ($\theta_i$) also plays a significant role and that the resonance peak scales with $\theta_i$. Thus, the wavelength at the resonance peak is a function of $\theta_i$. There's a strong dependency among $w_1$, $p_1$, $\lambda$, and $\theta_i$ in the one-dimensional (1D) case for dimension X, and among $w_1$, $w_2$, $p_1$, $p_2$, $\lambda$, and $\theta_i$ in the two-dimensional (2D) case for dimensions X and Y. A rough estimation for the peak resonance in a 50:50 grating (i.e., a half high, half low grating) is given in Equations (4A) and (4B) that evolves from the phase match condition for coupling of the first order. The angles $\theta_{p1}$ and $\theta_{p2}$ in Equation (4A) and (4B) is the propagation angle inside the semiconductor layer 18 with respect to the propagation component in the X direction and the propagation component in the Y direction, respectively).

$$p_1 = \lambda/(n_2 \sin \theta_{p1} - n_1 \sin \theta_i) \quad (4A)$$

$$p_2 = \lambda/(n_2 \sin \theta_{p2} - n_1 \sin \theta_i) \quad (4B)$$

The presented devices could be used for any optical data transmission or clock transmission without any need for an on-chip laser. When sending data from one chip to another, an external laser source is "embossed" by on-chip information by modulation of the grating's refractive index. In an optical clock application, the laser source provides an ultra high precise clock signal that will be detected by the device. Clock-gating is possible by using a device in detection or coupling mode.

Recent research activities in countless companies and research facilities tried to implement an on-chip laser for optical communication. It has been shown, that it is possible, but the optical power is pretty small and the required process changes are extremely expensive.

The "embossing" of data on an incident wave resolves the need for on-chip lasers. No on-chip heating problem occurs and no process change is necessary. A malfunction of the laser source is not critical, because it could be exchanged externally.

Until now, it has been impossible to integrate optical devices into standard CMOS chips in a fully monolithic manner. Standard Mach-Zehnder Interferometer are quite large and have no reflective capability (i.e., no embossing of information on an incident wave is possible). Any received information has to be kept on-chip first.

In contrast, the device of the present invention could be designed to work in three (or a subset of three) modes and is therefore highly flexible. Since there are no long distances within the device, the device is very fast. The entire device is fully process compatible and is therefore producible at low cost and/or without additional cost for technology changes. The device is built from easy building blocks as shown in FIG. 11 and FIG. 9 that could be used to assemble a device of arbitrary size. This gives another degree of freedom in terms of the required performance (photo current, irradiance in the semiconductor layer 18, intensity and shape of the reflected wave)

For receiving an optical signal, the device may be designed in the coupling or detection mode. If the signal is to be distributed over the chip, then the coupling mode would be selected. If an electrical signal to be generated is intended to control something, then the detection mode is used. In one embodiment, since it may not be necessary to detect or distribute the signal at all times, the design is capable of switching the distribution/detection OFF. This will be done by applying the voltage to the grating, changing the refractive index, and finally shifting the maximum irradiance away from the semiconductor layer 18 (e.g., to the buried oxide layer 12). Alternatively, the optical signal could be used to switch something ON, in which case the grating has been designed to have the maximum irradiance below the channel region 13 of the semiconductor layer 18 in steady state and lifts the irradiance to the semiconductor layer 18 if the voltage is applied to the grating. This is called the reverse switching scheme. This mode is applicable to all three modes (coupling mode, detection mode, reflection mode).

When it is desired to send information from one chip to another by optics, the device may be designed and used in the reflection mode. This device would have a grating that is capable of conditionally shifting (by the applied voltage) fractions of the incident wave by half its wavelength in the ideal case. A superposition of shifted and non-shifted wave causes a cancellation of the reflected wave which is equivalent to a binary '0'. The receiver may have a device in detection mode (or any other device that is sensitive to the wavelength) to receive a stream of information. The sender has no internal laser but embosses its information on the incident wave.

Figure 12:
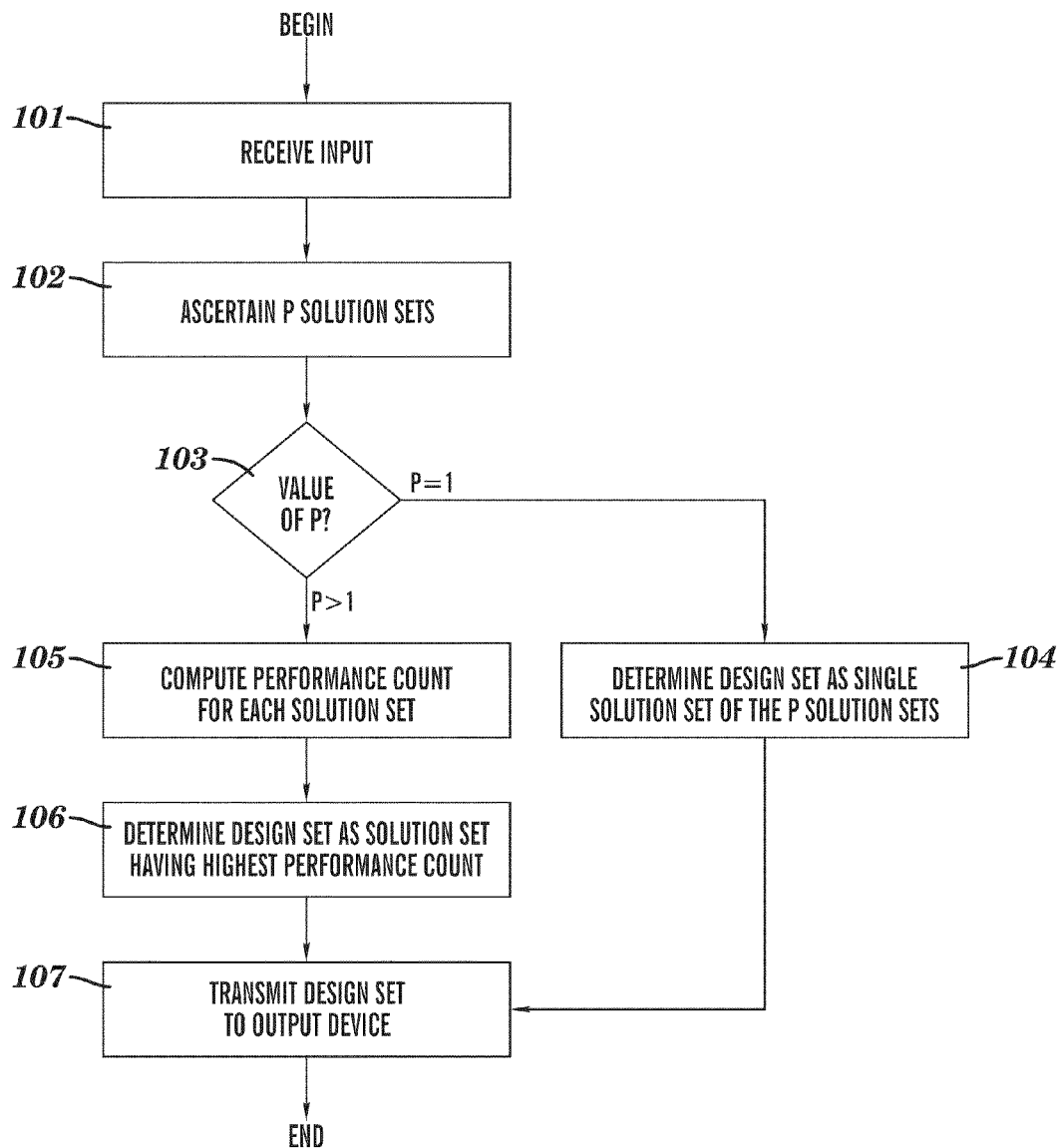
FIG. 12 is a flow chart describing a method for designing a device to operate in a coupling mode, a detection mode, or a reflection mode, wherein light having a wavelength is incident upon a semiconductor structure comprised by the device at an incident angle, in accordance with embodiments of the present invention.
Figure 13:
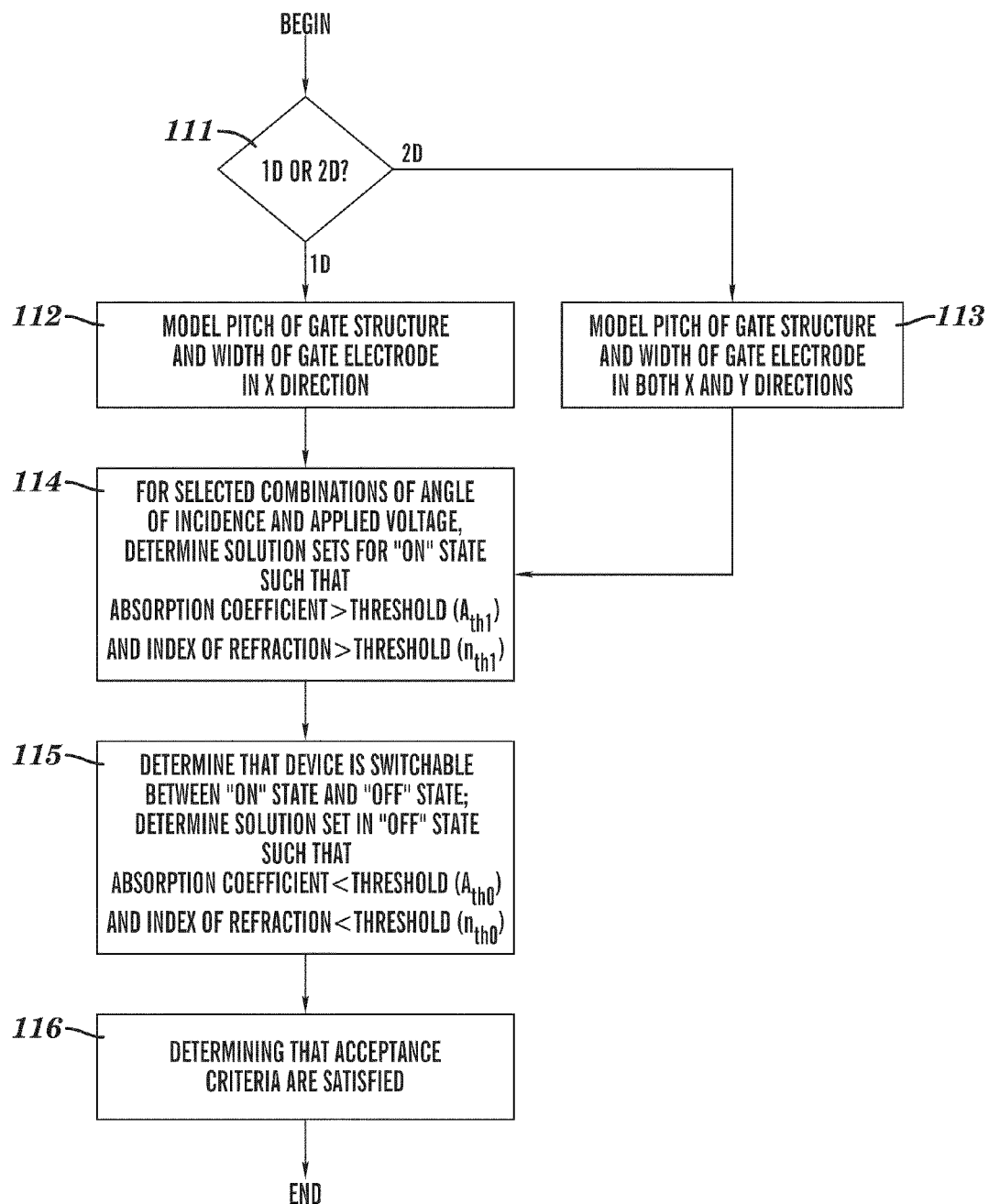
FIG. 13 is a flow chart that describes ascertaining solution sets for the coupling mode, in accordance with embodiments of the present invention.
Figure 14:
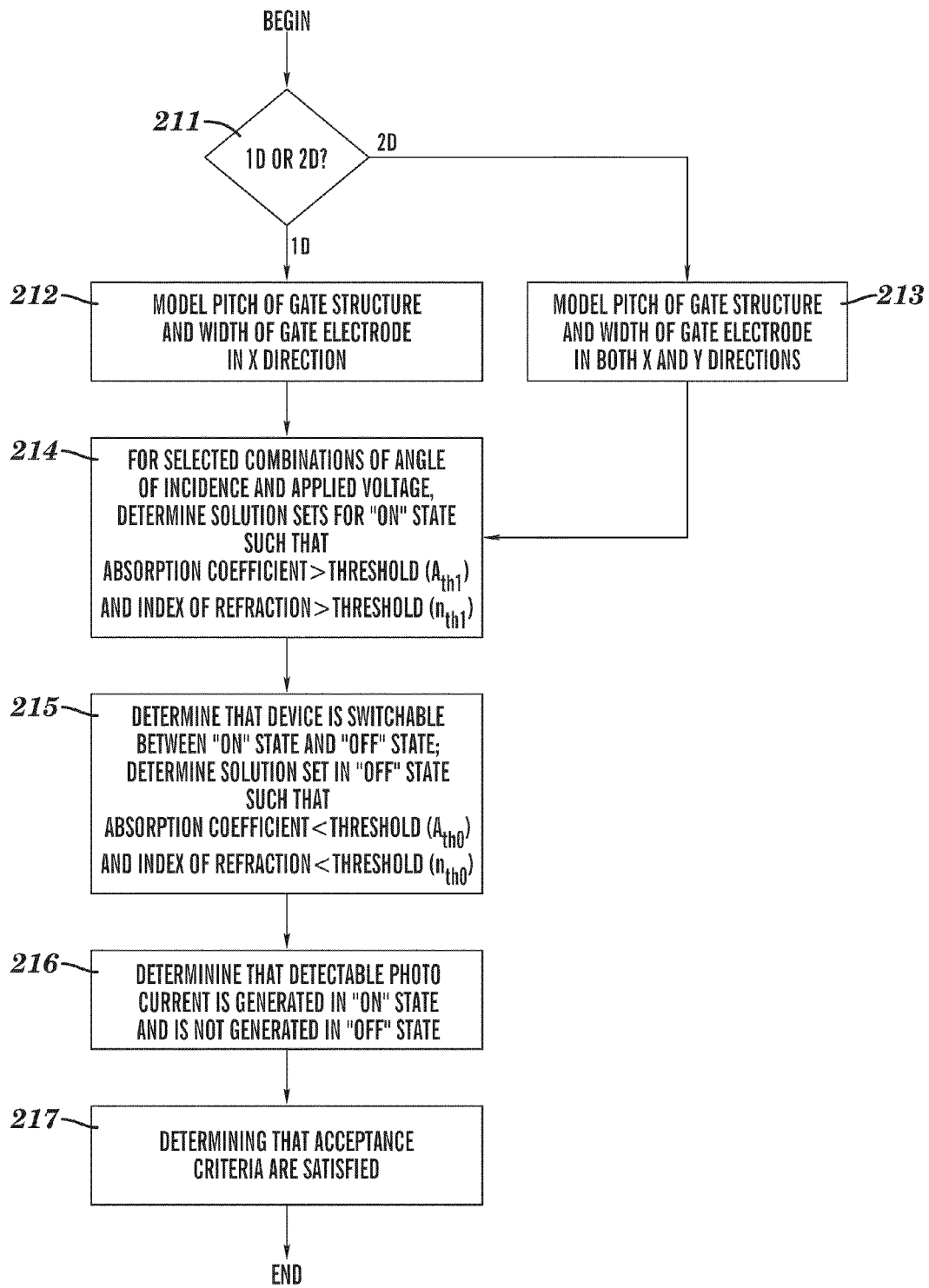
FIG. 14 is a flow chart that describes ascertaining solution sets for the detection mode, in accordance with embodiments of the present invention.
Figure 15:
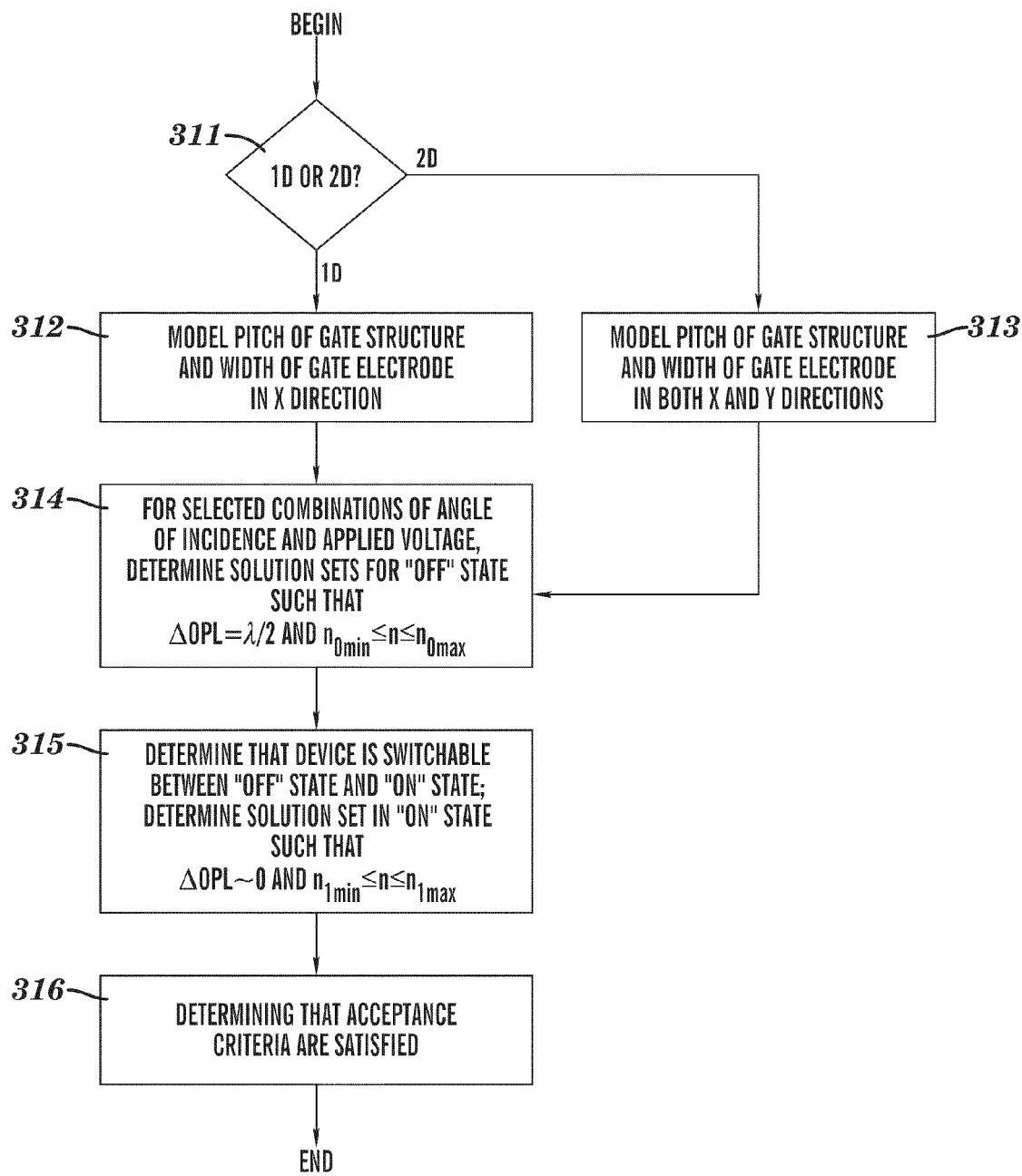
FIG. 15 is a flow chart that describes ascertaining solution sets for the reflection mode, in accordance with embodiments of the present invention.

FIG. 12 is a flow chart describing a method for designing a device to operate in a coupling mode, a detection mode, or a reflection mode, wherein light having a wavelength $\lambda$ is incident upon a semiconductor structure comprised by the device at an incident angle ($\theta_i$) with respect to a direction opposite to a Z direction, in accordance with embodiments of the present invention. The structure described infra for the flow charts of FIG. 12 is depicted in FIGS. 1-5 and 7-11 which have been described supra. The method of FIG. 12 comprises steps 101-107. FIGS. 13, 14, and 15 depicts step 102 of FIG. 12 in greater detail for the coupling mode, the detection mode, and the reflection mode, respectively.

In FIG. 12, step 101 receives input for designing the device to operate in the coupling mode, the detection mode, or the reflection mode. The semiconductor structure 10 comprises a bulk semiconductor substrate 11 that includes a first semiconductor material, a buried oxide layer 12 on the substrate 11 and comprising an electrically insulative material and having an index of refraction $n_3$, a semiconductor layer 18 on and in direct mechanical contact with the buried oxide layer 12 and having an index of refraction $n_2$ and having a thickness r in the Z direction that is perpendicular to the top surface of the semiconductor layer 18, a plurality of grating structures 35 on and in direct mechanical contact with a top surface 19 of the semiconductor layer 18, and a passivation layer 17 on and in direct mechanical contact with both the grating structure 35 and portions of the semiconductor layer 18 and comprising an electrically insulating material and having an index of refraction $n_1$, wherein $n_2 > n_3$ and $n_2 > n_1$.

For the coupling mode, the semiconductor layer 18 comprises a plurality of semiconductor channel regions 13 and a plurality of doped semiconductor regions 14A and 14B in an alternating sequence of channel regions 13 in which each channel region 13 comprises a second semiconductor material that is undoped and is disposed between and in direct mechanical contact with a N+ doped semiconductor region 14A of the plurality of doped semiconductor regions and a P+ doped semiconductor region 14B of the plurality of doped semiconductor regions. For best performance and to avoid absorption inside the silicon layer 18, the device in coupling mode should not comprise the alternating PIN structure.

For the detection mode, the semiconductor layer 18 comprises a plurality of semiconductor channel regions 13 and a plurality of doped semiconductor regions 14A and 14B in an alternating sequence of channel regions 13 in which each channel region 13 comprises a second semiconductor material and is disposed between and in direct mechanical contact with a N+ doped semiconductor region 14A of the plurality of doped semiconductor regions and a P+ doped semiconductor region 14B of the plurality of doped semiconductor regions. Each channel region 13 is a P− doped or N− doped intrinsic semiconductor region (I region) which in combination with the N+ and P+ doped semiconductor regions 14A and 14B between which each I region is disposed (and in direct mechanical contact with) forms a PIN structure.

For the reflection mode, the semiconductor layer 18 may comprise a plurality of semiconductor channel regions 13 and a plurality of doped semiconductor regions 14A and 14B in an alternating sequence of channel regions 13 in which each channel region 13 comprises a second semiconductor material and is disposed between and in direct mechanical contact with a N+ doped semiconductor region 14A of the plurality of doped semiconductor regions and a P+ doped semiconductor region 14B of the plurality of doped semiconductor regions. Each channel region 13 comprises a second semiconductor material that is either: (1) undoped and is disposed between and in direct mechanical contact with a N+ doped semiconductor region 14A of the plurality of doped semiconductor regions and a P+ doped semiconductor region 14B of the plurality of doped semiconductor regions; or (2) is a P− doped or N− doped intrinsic semiconductor region (I region) which in combination with the N+ and P+ doped semiconductor regions 14A and 14B between which each I region is disposed (and in direct mechanical contact with) forms a PIN structure. The alternating P-I-N structure is not required for the functionality of a device in the reflection mode, but. may be helpful for a device in a mixed mode operation (e.g., detection and reflection mode).

Each grating structure 35 comprises a notch 15 and an insulator 16 such that the notch 15 comprises a third semiconductor material and the insulator 16 is disposed between and in direct mechanical contact with the notch 15 and a corresponding channel region 13 of the plurality of channel regions. The grating structures 35 are distributed in a periodic pattern having a pitch (i.e., period) $p_1$ in an X direction that is orthogonal to the Z direction, wherein each grating structure 35 has a height $h_g$ in the Z direction above the top surface 18 of the semiconductor layer 18. Each notch 15 is defined by its width ($w_1$) in the X direction.

A voltage V applied between an anode or cathode of each notch 15 and a cathode or anode, respectively, at the corresponding doped semiconductor region (14A or 14B) in the semiconductor layer 18 induces a change in the complex index of refraction of a semiconductor domain layer 18 and the grating structure 35. The changed imaginary part of the complex index of refraction defines a changed absorption coefficient ($\Delta a$). The changed real part of the complex index of refraction defines a changed physical index of refraction ($\Delta n$). The incident angle $\theta_i$ is within a range defined by $\theta_{i,min} \leq \theta_i \leq \theta_{i,max}$, and the applied voltage V is within a range defined by $V_{min} \leq V \leq V_{max}$. For the coupling mode for the two-dimensional (2D) case, each grating is displaced from an adjacent grating by a gap d in the Y direction.

The received input in step 101 for the coupling mode, the detection mode, and the reflection mode comprises a value of $\lambda$, r, $h_g$, $\lambda_{i,min}$, $\theta_{i,max}$, $V_{min}$, $V_{max}$, acceptance criteria, and performance criteria. Additional input for the coupling mode and the detection mode includes absorption coefficient thresholds ($A_{th1}$) and ($A_{th0}$) as well as index of refraction thresholds ($n_{th1}$) and ($n_{th0}$). Additional input for the detection mode includes a value of the gap d in the Y direction, absorption coefficient thresholds ($A_{th1}$) and ($A_{th0}$), and index of refraction thresholds ($n_{1min}$), ($n_{1max}$), ($n_{0min}$), and ($n_{0max}$) such that $n_{1min} < n_{1max}$ and $n_{0min} < n_{0max}$. In one embodiment, the absorption coefficient thresholds ($A_{th1}$) and ($A_{th0}$) have numerical which are mode dependent and may therefore be different for different modes.

For the coupling mode and the detection mode, step 102 ascertains P solution sets (P≧1) at which the device operates in an ON state in which $V=V_1$ for causing the changed absorption coefficient to exceed $A_{th1}$ and for causing the changed index of refraction (n) to exceed $n_{th1}$ and at which the acceptance criteria are satisfied. Ascertaining the P solution sets comprises, for each solution set, calculating $\Delta a$ and $\Delta n$ according to $\Delta a(V)$ and $\Delta n(V)$, wherein $\Delta a(V)$ and $\Delta n(V)$ is a specified function of V (e.g., see Equations (3A) and (3B)). Each solution set of the P solution sets comprises $p_1$, $w_1$, $\theta_i$, and $V_1$. FIG. 13 describes step 102 in more detail for the coupling mode. FIG. 14 describes step 102 in more detail for the detection mode.

For the reflection mode, step 102 ascertains P solution sets (P≧1) at which the device operates in an OFF state in which $V=V_0$ for causing $\Delta OPL=\lambda/2$ to be satisfied and for causing the changed index of refraction (n) to satisfy $n_{0min} \leq n \leq n_{0max}$ and at which the acceptance criteria are satisfied. Ascertaining the P solution sets comprises, for each solution set, calculating $\Delta a$ and $\Delta n$ according to $\Delta a(V)$ and $\Delta n(V)$ and calculating $\delta r$ as an approximation of the path length of a traversing wave considering no diffractive effects, via geometric ray tracing of the light through the semiconductor domain for the incident angle $\theta_i$, wherein $\Delta a(V)$ and $\Delta n(V)$ is a specified function of V (e.g., see Equations (3A) and (3B)). Each solution set of the P solution sets comprises $p_1$, $w_1$, $\theta_i$, and $V_0$. FIG. 15 describes step 102 in more detail.

In FIG. 12, step 103 determines whether P=1 or P>1.

If step 103 determines that P=1, then the P solution sets consist of a single solution set and step 104 is next executed to a determine a design set for the ON state (coupling mode or detection mode) or OFF state (reflection mode) as being the single solution set, followed by execution of step 107.

If step 103 determines that P>1, then steps 105 and 106 are next executed. Step 105 computes a performance count with respect to the performance criteria for each solution set of the P solution sets. Exemplary performance criteria include constraints (e.g., maximum or minimum values, ranges, etc.) for both the ON and OFF states with respect to any the following parameters or combinations thereof: intensity of reflected wave switching speed (i.e., RC constant) (all three modes), device size (all three modes), bandwidth (all three modes), power consumption (all three modes), irradiance at the output (coupling mode only), photo current (detection mode only), etc.

Step 106 determines the design set for the ON state as being a solution set of the P solution sets in the ON state having the highest computed performance count. Then step 107 is next executed.

Step 107 transmits the design set for the ON state (coupling mode or detection mode) or OFF state (reflection mode) to an output device. The output device may comprise a data storage device, a data display device, a printing device, etc. or any combination thereof.

In one embodiment, the simulations may run also with different angles of incidence ($\theta_i$) and different grating widths ($w_1$) as an alternative to different angles of incidence and different voltages. The structure may be optimized for its two steady state conditions in the ON state and the OFF state. If no good solution is found, a higher diffraction order may be selected. If a useable design has been found, the physical dimensions may be drawn in the layout tool.

Next, step 102 of FIG. 12 will be described in more detail in FIG. 13, FIG. 14, and FIG. 15 for the coupling mode, the detection mode, and the reflection mode, respectively.

FIG. 13 is a flow chart that describes ascertaining solution sets for the coupling mode, in accordance with embodiments of the present invention. The flow chart of FIG. 13 comprises steps 111-116.

In FIG. 13, step 111 determines whether the method is for a one-dimensional (1D) case or for a two-dimensional (2D) case. In one embodiment, the grating structure 35 is periodic in only the X direction, which defines a one-dimensional (1D) case. In one embodiment, the grating structure 35 is periodic in both the X direction and a Y direction that is orthogonal to both the X and Z directions, which defines a two-dimensional (2D) case. Furthermore, if polarization effects are accounted for, then a 2D grating structure is implemented.

If step 111 determines that the method is for the 1D case, then step 112 models the pitch ($p_1$) of the grating structure 35 and width ($w_1$) of the notch 15 in the X direction, followed by execution of step 114.

If step 111 determines that the method is for the 2D case, then step 113 models the pitch ($p_1$) of the grating structure 35 and the width ($w_1$) of the notch 15 in the X direction as well as the pitch ($p_2$) of the grating structure 35 and the width ($w_2$) of the notch 15 in the Y direction, followed by execution of step 114.

Step 114 determines for the ON state a solution set for each combination of a specified number ($N_C$) of selected combinations of the angle of incidence ($\theta_i$) and the applied voltage (V), such that the changed absorption coefficient (due to the applied voltage) exceeds the absorption coefficient threshold ($A_{th1}$) and the changed index of refraction (due to the applied voltage) exceeds the index of refraction threshold ($n_{th1}$), for each combination of the $N_C$ combinations, wherein $N_C$ is at least 2.

The $N_C$ combinations of $\theta_i$ and V may be selected in various ways. In one embodiment, a range of $\theta_i$ defined by $\theta_{i,min} \leq \theta_i \leq \theta_{i,max}$ is specified and a range of V defined by $V_{min} \leq V \leq \theta_{Vmax}$ is specified. In this embodiment, successive combinations of $\theta_i$ and V are randomly generated from the range of $\theta_i$ and the range of V. Each such randomly generated combination of $\theta_i$ and V is retained as one of the $N_C$ combinations if the associated changed absorption coefficient exceeds $A_{th1}$; otherwise the randomly generated combination of $\theta_i$ and V is discarded. The successive combinations of $\theta_i$ and V are randomly generated within a valid range constrained by Equations (1), (3), and (4) (or by Equations (1) and (3)) and retained or discarded as described supra, until the $N_C$ combinations (in which the associated changed absorption coefficient exceeds $A_{th1}$) have been generated. Each combination of $\theta_i$ and V is generated by randomly selecting $\theta_i$ from a distribution between $\theta_{i,min}$ and $\theta_{i,max}$ and randomly selecting V from a distribution between $V_{min}$ and $V_{max}$. Randomly selecting a parameter $\mu$ from a distribution means randomly selecting the parameter $\mu$ from a specified probability distribution (e.g., a specified uniform distribution, normal distribution, etc.) in $\mu$.

In one embodiment, values of $\theta_i$ may be specified between $\theta_{i,min}$ and $\theta_{i,max}$ instead of selecting the values of $\theta_i$ randomly between $\theta_{i,min}$ and $\theta_{i,max}$, to form discrete set of values of $\theta_i$ from $\theta_{i,min}$ to $\theta_{i,max}$. Similarly, values of V may be specified between $V_{min}$ and $V_{max}$ instead of selecting the values of V randomly between $V_{min}$ and $V_{max}$, to form discrete set of values of V from $V_{min}$ to $V_{max}$. The discrete set of values of $\theta i$ and V may each be uniformly distributed or non-uniformly distributed. In one implementation, all of the discrete values of $\theta_i$ and/or V are processed to form a solution set as described infra.

In one implementation, the discrete values of $\theta_i$ and/or V are processed starting from the maximum value (i.e., from $\theta_{i,max}$ and/or $V_{max}$) and successively decreased to the next lower value $\theta_i$ and/or V in the discrete set of values of $\theta i$ and/or V until it is determined that the next lower value $\theta_i$ and/or V causes the device to fail as evidenced by violation of a fabrication requirement or an operational requirement for the device. An example of violation of a fabrication requirement is exceeding a specified maximum cost of fabricating the device. An example of violation of an operational requirement is exceeding a specified maximum temperature during operation of the device. Following a determination that the device fails at a valued $\theta_i$ and/or V in the discrete set of values of $\theta_i$ and/or V, no additional lower values of $\theta_i$ and/or V are processed.

For the one-dimensional (1D) case for each combination of $\theta_i$ and V of the $N_C$ combinations and the input of $\lambda$, r, and $h_g$, step 114 determines a solution set comprising $p_1$, $w_1$, $\theta_i$, and $V_1$ for as follows. The pitch $p_1$ is determined from Equation (4A) for a 50:50 grating such that the changed absorption coefficient (due to $\Delta a$) exceeds $A_{th1}$. The changed absorption coefficient due to the change in the absorption coefficient ($\Delta a$) caused by the applied voltage V is computed from Equations (3A) and (3C)-(3D) for the value of V in the combination of $\theta_i$ and V. The value of $A_{th1}$ is chosen to ensure that at least a minimum power of the incident light 20 is absorbed in the semiconductor layer 18. In one embodiment, $A_{th1}$ is chosen to ensure that the minimum absorbed power of the incident light 20 corresponds to maximum irradiance in the semiconductor layer 18. If the changed absorption coefficient is less than $A_{th1}$, then $p_1$ and/or $\lambda$ may be adjusted in conjunction with Equation (4A) and functional dependencies (analogous to FIG. 6) describing absorption rate versus $\lambda$ for each combination of $\lambda$, $\theta_i$, and V, in order to ensure that the changed absorption coefficient exceeds $A_{th1}$. After the pitch $p_1$ is determined, the width $w_1$ is selected randomly from a range of $0 < w_1 < p_1$, using any specified distribution. If $w_1$ satisfies Equation (1A), then the design of the grating fits the criterion for an attached waveguide. The intensity of light may be simulated or measured in or at the output of the intrinsic or attached waveguide to confirm the changed absorption coefficient exceeds $A_{th1}$. (e.g., maximum irradiance in the semiconductor layer 18). In one embodiment, however, there is no attached or intrinsic waveguide wherein Equation (1A) is not required to be satisfied.

For the two-dimensional (2D) case for each combination of $\theta_i$ and V of the $N_C$ combinations and the input of $\lambda$, r, and $h_g$, step 114 determines a solution set comprising $p_1$, $w_1$, $p_2$, $w_2$, $\theta_i$, and $V_1$ for as follows. The pitch $p_1$ and pitch $p_2$ are determined from equation (4A) and (4B) such that the changed absorption coefficient (due to $\Delta a$) exceeds $A_{th1}$. The changed absorption coefficient due to the change in the absorption coefficient ($\Delta a$) caused by the applied voltage V is computed from Equations (3A) and (3C)-(3D) for the value of V in the combination of $\theta_i$ and V. The value of $A_{th1}$ is chosen to ensure that at least a minimum power of the incident light 20 is absorbed in the semiconductor layer 18. In one embodiment, $A_{th1}$ is chosen to ensure that the minimum absorbed power of the incident light 20 corresponds to maximum irradiance in the semiconductor layer 18. If the changed absorption coefficient is less than $A_{th1}$, then $p_1$ and/or $\lambda$ may be adjusted in conjunction with Equation (4A) and functional dependencies (analogous to FIG. 6) describing absorption rate versus $\lambda$ for each combination of $\lambda$, $\theta_i$, and V, in order to ensure that the changed absorption coefficient exceeds $A_{th1}$. After the pitches $p_1$ and $p_2$ are determined, the widths $w_1$ and $w_1$ are selected randomly from a range of $0<w_1<p_1$ and $0<w_2<p_2$, using any specified distribution. If $w_1$ and $w_2$ satisfy Equations (1A) and (1B), respectively, then the grating design fits the design criteria for an attached or intrinsic waveguide. In one embodiment, however, there is no attached waveguide wherein Equations (1A) and (1B) are not required to be satisfied.

Step 115 determines that the device is switchable from the ON state to an OFF state and from the OFF state to the ON state by setting the applied voltage V to $V_1$ for the ON state and to $V_0$ for the OFF state, wherein $V_0$ causes the changed absorption coefficient to be less than a specified (e.g., inputed) absorption coefficient threshold ($A_{th0}$) and causes the changed index of refraction to be less than a specified (e.g., inputed) index of refraction threshold ($n_{th0}$), which defines a design combination of p, w, $\theta_i$, and $V_0$ for the OFF state subject to $A_{th0} \neq A_{th1}$ (e.g., $A_{th0} < A_{th1}$). In the OFF state for the 1D case, $p_1$, $w_1$, and $\theta_i$ have the same values as for the ON state. In the OFF state for the 2D case, $p_1$, $w_1$, $p_2$, $w_2$, and $\theta_i$ have the same values as for the ON state. Step 115 determines $V_0$ for the OFF state by randomly selecting a voltage $V_0$ from the range $V_{min} \leq V_0 \leq V_{max}$ for as many random selections of $V_0$ (from a specified distribution between $V_{min}$ and $V_{max}$) as is necessary to compute the change of the absorption coefficient to be less than $A_{th0}$.

In one embodiment, values of $\theta_i$ may be specified between $\theta_{i,min}$ and $\theta_{i,max}$ instead of selecting the values of $\theta_i$ randomly between $\theta_{i,min}$ and $\theta_{i,max}$, to form discrete set of values of $\theta_i$ from $\theta_{i,min}$ to $\theta_{i,max}$. Similarly, values of V may be specified between $V_{min}$ and $V_{max}$ instead of selecting the values of V randomly between $V_{min}$ and $V_{max}$, to form discrete set of values of V from $V_{min}$ to $V_{max}$. The discrete set of values of $\theta_i$ and V may each be uniformly distributed or non-uniformly distributed. In one implementation, all of the discrete values of $\theta_i$ and/or V are processed to form a solution set as described infra.

In one implementation for the ON case, the discrete values of $\theta_i$ and/or V are processed starting from the maximum value (i.e., from $\theta_{i,max}$ and/or $V_{max}$) and successively decreased to the next lower valued $\theta_i$ and/or V in the discrete set of values of $\theta_i$ and/or V until it is determined that the next lower value $\theta_i$ and/or V causes the device to fail as evidenced by violation of a fabrication requirement or an operational requirement for the device. An example of violation of a fabrication requirement is exceeding a specified maximum cost of fabricating the device. An example of violation of an operational requirement is exceeding a specified maximum temperature during operation of the device. Following a determination that the device fails at a value $\theta_i$ and/or V in the discrete set of values of $\theta_i$ and/or V, no additional lower values of $\theta_i$ and/or V are processed.

In one implementation for the OFF case, the discrete values of $\theta_i$ and/or V are processed starting from the minimum value (i.e., from $\theta_{i,min}$ and/or $V_{min}$) and successively increased to the next higher value $\theta_i$ and/or V in the discrete set of values of $\theta_i$ and/or V until it is determined that the next higher value $\theta_i$ and/or V causes the device to fail as evidenced by violation of a fabrication requirement or an operational requirement for the device. An example of violation of a fabrication requirement is exceeding a specified maximum cost of fabricating the device. An example of violation of an operational requirement is exceeding a specified maximum temperature during operation of the device. Following a determination that the device fails at a value $\theta_i$ and/or V in the discrete set of values of $\theta_i$ and/or V, no additional lower values of $\theta_i$ and/or V are processed.

Step 115 determines coincident solutions for ON and OFF case and transmits design solutions to an output device. In one embodiment for the OFF state, step 115 transmits the set $\{p_1, w_1, \theta_i, \text{and } V_0\}$ for the 1D case to the output device. In one embodiment for the OFF state, step 115 transmits the set $\{p_1, w_1, p_2, w_2, \theta_i, \text{and } V_0\}$ for the 2D case to the output device. The output device may comprise a data storage device, a data display device, a printing device, etc. or any combination thereof.

Step 116 determines that acceptance criteria are satisfied. In one embodiment, determining that acceptance criteria are satisfied comprises determining that design rules meet design criteria for fabricating the semiconductor structure 10 as determined by the accuracy of lithography used to fabricate the semiconductor structure 10. In one embodiment, determining that acceptance criteria are satisfied comprises determining that $p_1$ is within a specified range of $p_1$ and that and $w_1$ is within a specified range of $w_1$. In one embodiment, determining that acceptance criteria are satisfied comprises determining that a specified functional relationship between $p_1$ and $w_1$ is satisfied (e.g., $w_1/p_1$ is less than a given threshold or $w_1/p_1$ is greater than a given threshold) to fit the waveguide criterion of Equation (1A) for the 1D case or Equations (1A) and (1B) for the 2D case. The method of FIG. 13 discards any solution set not satisfying the acceptance criteria.

FIG. 14 is a flow chart that describes ascertaining solution sets for the detection mode, in accordance with embodiments of the present invention. The flow chart of FIG. 14 comprises steps 211-217.

Ascertaining the P solution sets comprises, for each solution set, calculating $\Delta a$ according to $\Delta a(V)$, wherein $\Delta a(V)$ is a specified function of V (e.g., see Equation (3A)). Each solution set of the P solution sets comprises $p_1$, $w_1$, $\theta_i$, and $V_1$. FIG. 15 describes step 202 in more detail and comprises steps 211-217.

In FIG. 14, step 211 determines whether the method is for a one-dimensional (1D) case or for a two-dimensional (2D) case. In one embodiment, the grating structure 35 is periodic in only the X direction, which defines a one-dimensional (1D) case. In one embodiment, the grating structure 35 is periodic in both the X direction and a Y direction that is orthogonal to both the X and Z directions, which defines a two-dimensional (2D) case. Furthermore, if polarization effects are accounted for, then a 2D grating structure is implemented.

If step 211 determines that the method is for the 1D case, then step 212 models the pitch ($p_1$) of the grating structure 35 and width ($w_1$) of the notch 15 in the X direction, followed by execution of step 214.

If step 211 determines that the method is for the 2D case, then step 213 models the pitch ($p_1$) of the grating structure 35 and the width ($w_1$) of the notch 15 in the X direction as well as the pitch ($p_2$) of the grating structure 35 and the width ($w_2$) of the notch 15 in the Y direction, followed by execution of step 214.

Step 214 determines for the ON state a solution set for each combination of a specified number ($N_C$) of selected combinations of the angle of incidence ($\theta_i$) and the applied voltage (V), such that the changed absorption coefficient (due to the applied voltage) exceeds the absorption coefficient threshold ($A_{th1}$) and the changed index of refraction (due to the applied voltage) exceeds the index of refraction threshold ($n_{th1}$), for each combination of the $N_C$ combinations, wherein $N_C$ is at least 2.

The $N_C$ combinations of $\theta_i$ and V may be selected in various ways. In one embodiment, a range of $\theta_i$ defined by $\theta_{i,min} \leq \theta_i \leq \theta_{i,max}$ is specified and a range of V defined by $V_{min} \leq V \leq V_{Vmax}$ is specified. In this embodiment, successive combinations of $\theta_i$ and V are randomly generated from the range of $\theta_i$ and the range of V. Each such randomly generated combination of $\theta_i$ and V is retained as one of the $N_C$ combinations if the associated changed absorption coefficient exceeds $A_{th1}$; otherwise the randomly generated combination of $\theta_i$ and V is discarded. The successive combinations of $\theta_i$ and V are randomly generated within a valid range constrained by Equations (3) and (4) and retained or discarded as described supra, until the $N_C$ combinations have been generated. Each combination of $\theta_i$ and V is generated by randomly selecting $\theta_i$ from a specified distribution between $\theta_{i,min}$ and $\theta_{i,max}$ and randomly selecting V from a specified distribution between $V_{min}$ and $V_{max}$. Any specified distribution for selecting $\theta_i$ and V is within the scope of the present invention.

For the one-dimensional (1D) case for each combination of $\theta_i$ and V of the $N_C$ combinations and the input of $\lambda$, r, and $h_g$, step 214 determines a solution set comprising $p_1$, $w_1$, $\theta_i$, and $V_1$ for as follows. The pitch $p_1$ is derived from Equation (4A) for a 50:50 grating. In one embodiment, the grating has maximum efficiency for the steady state for the normal switching scheme and has minimum efficiency for the steady state for the reversed switching scheme. In the steady state, the device operates without an applied voltage which imposes functional dependencies. For example, functional dependencies (analogous to FIG. 6) may be used to determine a value of $p_1$ at or near a peak of the changed absorption coefficient versus for each combination of $\lambda$, $\theta_i$, and V. The change in absorption coefficient ($\Delta a$) and refractive index ($\Delta n$) due to the applied voltage V is computed from Equations (3A)-(3D) for the value of V in the combination of $\theta_i$ and V, which results in the absorption coefficient (a) and the index of refraction (n) being changed. In one embodiment as a result of the applied voltage V, the changed absorption coefficient exceeds $A_{th1}$. The value of $A_{th1}$ may be chosen to ensure that at least a minimum power of the incident light 20 is absorbed in the semiconductor layer 18. In one embodiment, $A_{th1}$ is chosen to ensure that the minimum absorbed power of the incident light 20 corresponds to maximum irradiance in the semiconductor layer 18. If the changed absorption coefficient is less than $A_{th1}$ then $p_1$ and/or $\lambda$ and/or V may be adjusted in conjunction with Equation (4A) and functional dependencies (analogous to FIG. 6) describing absorption rate versus $\lambda$ for each combination of $\lambda$, $\theta_i$, and V, in order to ensure that the changed absorption coefficient exceeds $A_{th1}$. After the pitch $p_1$ is determined, the width $w_1$ is selected randomly from a range of $0<w_1<p_1$, using any desired distribution.

For the two-dimensional (2D) case for each combination of $\theta_i$ and V of the $N_C$ combinations and the input of $\lambda$, r, and $h_g$, step 214 determines a solution set comprising $p_1$, $w_1$, $p_2$, $w_2$, $\theta_i$, and $V_1$ for as follows. The pitch $p_1$ and pitch $p_2$ are determined from Equation (4A) and (4B) such that the changed absorption coefficient (due to $\Delta a$) exceeds $A_{th1}$. The changed absorption coefficient due to the change in the absorption coefficient ($\Delta a$) caused by the applied voltage V is computed from Equations (3A) and (3C)-(3D) for the value of V in the combination of $\theta_i$ and V. The value of $A_{th1}$ is chosen to ensure that at least a minimum power of the incident light 20 is absorbed in the semiconductor layer 18. In one embodiment, $A_{th1}$ is chosen to ensure that the minimum absorbed power of the incident light 20 corresponds to maximum irradiance in the semiconductor layer 18. If the changed absorption coefficient does not exceed $A_{th1}$, then $p_1$ and/or $\lambda$ may be adjusted in conjunction with Equation (4A) and functional dependencies (analogous to FIG. 6) describing absorption rate versus $\lambda$ for each combination of $\lambda$, $\theta_i$, and V, in order to ensure that the changed absorption coefficient exceeds $A_{th1}$. After the pitches $p_1$ and $p_2$ are determined, the widths $w_1$ and $w_2$ are selected randomly from a range of $0<w_1<p_1$ and $0<w_2<p_2$ and may be verified by simulation. If $w_1$ and $w_2$ satisfy Equations (1A) and (1B), respectively, then the grating design fits the design criteria for an attached waveguide. In one embodiment, however, there is no attached waveguide wherein Equations (1A) and (1B) are not required to be satisfied.

Step 215 determines that the device is switchable from the ON state to an OFF state and from the OFF state to the ON state by setting the applied voltage V to $V_1$ for the ON state and to $V_0$ for the OFF state, wherein $V_0$ causes the changed absorption coefficient to be less than a specified (e.g., inputed) absorption coefficient threshold ($A_{th0}$) and causes the changed index of refraction to be less than a specified (e.g., inputed) index of refraction threshold ($n_{th0}$), which defines a design combination of p, w, $\theta_i$, and $V_0$ for the OFF state. In one embodiment, $A_{th0} \neq A_{th1}$ (e.g., $A_{th0} < A_{th1}$) and $n_{th0} \neq n_{th1}$ (e.g., $n_{th0} < n_{th1}$). In the OFF state for the 1D case, $p_1$, $w_1$, and $\theta_i$ have the same values as for the ON state. In the OFF state for the 2D case, $p_1$, $w_1$, $p_2$, $w_2$, and $\theta_i$ have the same values as for the ON state. Step 215 determines $V_0$ for the OFF state by randomly selecting a voltage $V_0$ from the range $V_{min} \leq V_0 \leq V_{Vmax}$ for as many random selections of $V_0$ (from a uniform probability distribution between $V_{min}$ and $V_{max}$) as is necessary to compute the changed absorption coefficient to be less than $A_{th0}$. Step 215 determines coincident solutions for the ON and OFF case and transmits design solutions to an output device. In one embodiment for the OFF state, step 215 transmits the set $\{p_1, w_1, \theta_i, \text{and } V_0\}$ for the 1D case to the output device. In one embodiment for the OFF state, step 215 transmits the set $\{p_1, w_1, p_2, w_2, \theta_i, \text{and } V_0\}$ for the 2D case to the output device. The output device may comprise a data storage device, a data display device, a printing device, etc. or any combination thereof.

Step 216 determines that operation of the device in the ON state generates a detectable photo current in the PIN structure and operation of the device in the OFF state does not generate the detectable photo current in the PIN structure, which in one embodiment may be implemented by specifying a photo current threshold above which the photo current in the PIN structure is detectable, and at or below which the current in the PIN structure is detectable. In this embodiment, the photo current in the PIN structure is compared with the photo current threshold. As a result of this comparison, if the determined photo current in the PIN structure is determined to be above the photo current threshold then it is concluded that the photo current in the PIN structure is detectable, and if the determined photo current in the PIN structure is determined to be at or below the photo current threshold then it is concluded that the photo current in the PIN structure is not detectable. The method of FIG. 14 discards any solution set whose photo current in the PIN structure is determined to not have the characteristic of being detectable in the ON state and not detectable in the OFF state.

Step 217 determines that acceptance criteria are satisfied. In one embodiment, determining that acceptance criteria are satisfied comprises determining that design rules meet design criteria for fabricating the semiconductor structure 10 as determined by the accuracy of lithography used to fabricate the semiconductor structure 10. In one embodiment, determining that acceptance criteria are satisfied comprises by determining that $p_1$ is within a specified range of $p_1$ and that and $w_1$ is within a specified range of $w_1$. In one embodiment, determining that acceptance criteria are satisfied comprises determining that a specified functional relationship between $p_1$ and $w_1$ is satisfied (e.g., $w_1/p_1$ is less than a given threshold or $w_1/p_1$ is greater than a given threshold). In one embodiment, determining that acceptance criteria are satisfied comprises determining that the reflected wave is usable for detection. The method of FIG. 15 discards any solution set not satisfying the acceptance criteria.

FIG. 15 is a flow chart that describes ascertaining solution sets for the reflection mode, in accordance with embodiments of the present invention. The flow chart of FIG. 15 comprises steps 311-316.

In FIG. 15, step 311 determines whether the method is for a one-dimensional (1D) case or for a two-dimensional (2D) case. In one embodiment, the grating structure 35 is periodic in only the X direction, which defines a one-dimensional (1D) case. In one embodiment, the grating structure 35 is periodic in both the X direction and a Y direction that is orthogonal to both the X and Z directions, which defines a two-dimensional (2D) case. Furthermore, if polarization effects are accounted for, then a 2D grating structure is implemented.

If step 311 determines that the method is for the 1D case, then step 312 models the pitch ($p_1$) of the gate structure 35 and width ($w_1$) of the gate electrode 15 in the X direction, followed by execution of step 314.

If step 311 determines that the method is for the 2D case, then step 313 models the pitch ($p_1$) of the gate structure 35 and the width ($w_1$) of the gate electrode 15 in the X direction as well as the pitch ($p_2$) of the gate structure 35 and the width ($w_2$) of the gate electrode 15 in the Y direction, followed by execution of step 314.

Step 314 determines for the OFF state a solution set for each combination of a specified number ($N_C$) of selected combinations of the angle of incidence ($\theta_i$) and the applied voltage (V), such that $\Delta OPL=\lambda/2$ is satisfied due to the applied voltage V the relationship $a<A_{th0}$ is satisfied for the absorption coefficient (a) due to the applied voltage V, and the relationship $n_{0min} \leq n \leq n_{0max}$ is satisfied for the changed index of refraction (n) due to the applied voltage V, wherein $N_C$ is at least 2.

The $N_C$ combinations of $\theta_i$ and V may be selected in various ways. In one embodiment, a range of $\theta_i$ defined by $\theta_{i,min} \leq \theta_i \leq \theta_{i,max}$ is specified and a range of V defined by $V_{min} \leq V \leq \theta_{Vmax}$ is specified. In this embodiment, successive combinations of $\theta_i$ and V are randomly generated from the range of $\theta_i$ and the range of V. Each such randomly generated combination of $\theta_i$ and V is retained as one of the $N_C$ combinations if $\Delta OPL=\lambda/2$ is satisfied; otherwise the randomly generated combination of $\theta_i$ and V is discarded. The successive combinations of $\theta_i$ and V are randomly generated within a valid range constrained by Equations (2)-(4) and retained or discarded as described supra, until the $N_C$ combinations (in which $\Delta OPL=\lambda/2$) have been generated. Each combination of $\theta_i$ and V is generated by randomly selecting $\theta_i$ from a probability distribution between $\theta_{i,min}$ and $\theta_{i,max}$ and randomly selecting V from a distribution between $V_{min}$ and $V_{max}$ or by adjusting from the minimum and maximum voltage values to an acceptable or optimum voltage as described supra. In practice, a choice of which the probability distributions to use may be dictated by design considerations, sampling efficiency, etc.

For the one-dimensional (1D) case for each combination of $\theta_i$ and V of the $N_C$ combinations and the input of $\lambda$, r, and $h_g$, step 314 determines a solution set comprising $p_1$, $w_1$, $\theta_i$, and $V_1$ for as follows. The pitch $p_1$ is derived from Equation (4A) for a 50:50 grating such that $\Delta OPL=\lambda/2$.

Computation of the notch width $w_1$ utilizes the fact that, for a fixed input value of r and $h_g$, the total physical path length $\delta r$ is a function of $w_1$ as may be seen in FIGS. 6 and 2 in which the total physical path length $\delta r$ of the traversed path 34 in FIG. 6 satisfies Equation (5):

$$(\delta r/2)^2 = (h_g + r)^2 + (\gamma_1 w_1^2)/4 \quad (5)$$

wherein $\gamma_1$ is a ratio of a minimum width of the notch 15 to the width ($w_1$) of the notch 15 in the X direction. In one embodiment, the width of the notch 15 the X direction does not vary with Z so that $\gamma_1=1$. Applying $\Delta OPL=\lambda/2$ to Equation (2) yields Equation (6):

$$(\Delta n)(\delta r) = \lambda^2/(4\pi) \quad (6)$$

wherein $\Delta n$ is a function of V via Equation (3B) and $\delta r$ is a function of $w_1$ via Equation (5). Thus, Equation (6) represents an embodiment that determines a functional relationship between $w_1$ and V that satisfies $\Delta OPL=\lambda/2$ for the OFF state. In this embodiment, Equation (6) may be generalized to become Equation (7) expressed in terms of a specified (e.g., inputed) threshold $\Delta n_{th0}$:

$$|\Delta n - \lambda^2/(4\pi \delta r)| \leq \Delta n_{th0} \quad (7)$$

wherein Equation (7) reduces to Equation (6) in the limit of $\Delta n_{th0}=0$. Since V is fixed for each combination of $\theta_i$ and V of the $N_C$ combinations, Equation (6) or Equation (7) determines $w_1$ for each such combination of $\theta_i$ and V.

Functional dependencies (analogous to FIG. 6) may be used to determine a constraint on $p_1$ at or near a peak of the index of refraction (n) versus $\lambda$ for each combination of $\lambda$, $\theta_i$, and V. The change ($\Delta n$) in the index of refraction due to the applied voltage V>0 is computed from Equation (3B) for the value of V, which results in the absorption coefficient and index of refraction being changed. In one embodiment as a result of the applied voltage V for the OFF state, the changed index of refraction (n) satisfies the relationship $n_{0min} \leq n \leq n_{0max}$ and the changed absorption coefficient (a) satisfies the relationship $a<A_{th0}$. If the changed index of refraction (n) and the changed absorption coefficient (a) do not satisfy the preceding relationships, then $p_1$ and/or $\lambda$ and/or V may be adjusted in conjunction with Equation (4A) and functional dependencies (analogous to FIG. 6) describing index of refraction versus $\lambda$ for each combination of $\lambda$, $\theta_i$, and V, in order to ensure that the changed index of refraction (n) and the changed absorption coefficient (a) satisfy the preceding relationships.

For the two-dimensional (2D) case for each combination of $\theta_i$ and V of the $N_C$ combinations and the input of $\lambda$, r, and $h_g$, step 314 determines a solution set comprising $p_1$, $w_1$, $p_2$, $w_2$, $\theta_i$, and $V_1$ as follows. The pitch $p_1$ and pitch $p_2$ are determined from equation (4A) and (4B) such $\Delta OPL=\lambda/2$.

Computation of the notch widths $w_1$ and $w_2$ results in Equation (8), based on using the geometry of FIGS. 2 and 6 as was done to obtain Equation (5).

$$(\delta r/2)^2 = (h_g+r)^2 + (\gamma_1 w_1^2 + \gamma_2 w_2^2)/4 \quad (8)$$

wherein $\gamma_2$ is a ratio of a minimum width of the notch 15 to the width ($w_2$) of the notch 15 in the Y direction. In one embodiment, the width of the notch 15 the Y direction does not vary with Z so that $\gamma_2=1$. In Equation (6) for the 2D case, $\Delta n$ is a function of V via Equation (3B) and $\delta r$ is a function of $w_1$ and $w_2$ via Equation (8). Thus, Equation (8) determines a functional relationship between $w_1$ and $w_2$ and V that satisfies $\Delta OPL=\lambda/2$ for the OFF state. Equation (6) determines $\gamma_1 w_1^2 + \gamma_2 w_2^2$ for the value of $\theta_i$ and V currently being processed, which determines $w_1$ and $w_2$ if a constraint is specified between $w_1$ and $w_2$ (e.g., a specified ratio of $w_1$ to $w_2$ may be imposed as a constraint), or which permits multiple combinations and $w_1$ and $w_2$ if $w_1$ and $w_2$ are totally independent of each other.

Step 315 determines that the device is switchable from the OFF state to an ON state and from the ON state to the OFF state by setting the applied voltage V to $V_0$ for the OFF state and to $V_1$ for the ON state, wherein $V_1$ causes $\Delta OPL\sim 0$ to be satisfied, causes the absorption coefficient (a) to satisfy $a < A_{th1}$, and causes the index of refraction (n) to satisfy $n_{1min} \leq n \leq n_{1max}$, which defines a design combination of $p_1$, $w_1$, $\theta_i$, and $V_1$ for the ON state. In the ON state for the 1D case, $p_1$, $w_1$, and $\theta_i$ have the same values as for the OFF state. In the ON state for the 2D case, $p_1$, $w_1$, $p_2$, $w_2$, and $\theta_i$ have the same values as for the OFF state. Step 315 determines $V_1$ for the ON state by randomly selecting a voltage $V_1$ from the range $V_{min} \leq V_1 \leq V_{Vmax}$ for as many random selections of $V_1$ from a uniform probability distribution between $V_{min}$ and $V_{max}$) as is necessary to satisfy $\Delta OPL\sim 0$. Step 315 also transmits $V_1$ to an output device. Step 315 determines coincident solutions for the ON and OFF case and transmits design solutions to an output device. In one embodiment for the ON state, step 315 transmits the set $\{p_1, w_1, \theta_i, \text{and } V_1\}$ for the 1D case to the output device. In one embodiment for the OFF state, step 315 transmits the set $\{p_1, w_1, p_2, w_2, \theta_i, \text{and } V_1\}$ for the 2D case to the output device. The output device may comprise a data storage device, a data display device, a printing device, etc. or any combination thereof.

The condition $\Delta OPL\sim 0$ for the ON state may be generalized to become Equation (9) expressed in terms of a specified (e.g., inputed) threshold $\Delta n_{th1}$:

$$|\Delta n| \leq \Delta n_{th1} \quad (9)$$

wherein Equation (9) reduces to $\Delta OPL=0$ in the limit of $\Delta n_{th1}=0$.

Step 316 determines that acceptance criteria are satisfied. In one embodiment, determining that acceptance criteria are satisfied comprises determining that design rules meet design criteria for fabricating the semiconductor structure 10 as determined by the accuracy of lithography used to fabricate the semiconductor structure 10. In one embodiment, determining that acceptance criteria are satisfied comprises by determining that $p_1$ is within a specified range of $p_1$ and that and $w_1$ is within a specified range of $w_1$. In one embodiment, determining that acceptance criteria are satisfied comprises determining that a specified functional relationship between $p_1$ and $w_1$ is satisfied (e.g., $w_1/p_1$ is less than a given threshold or $w_1/p_1$ is greater than a given threshold). In one embodiment determining that acceptance criteria are satisfied comprises determining that the reflected wave is usable for detection. The method of FIG. 15 discards any solution set not satisfying the acceptance criteria.

Figure 16:
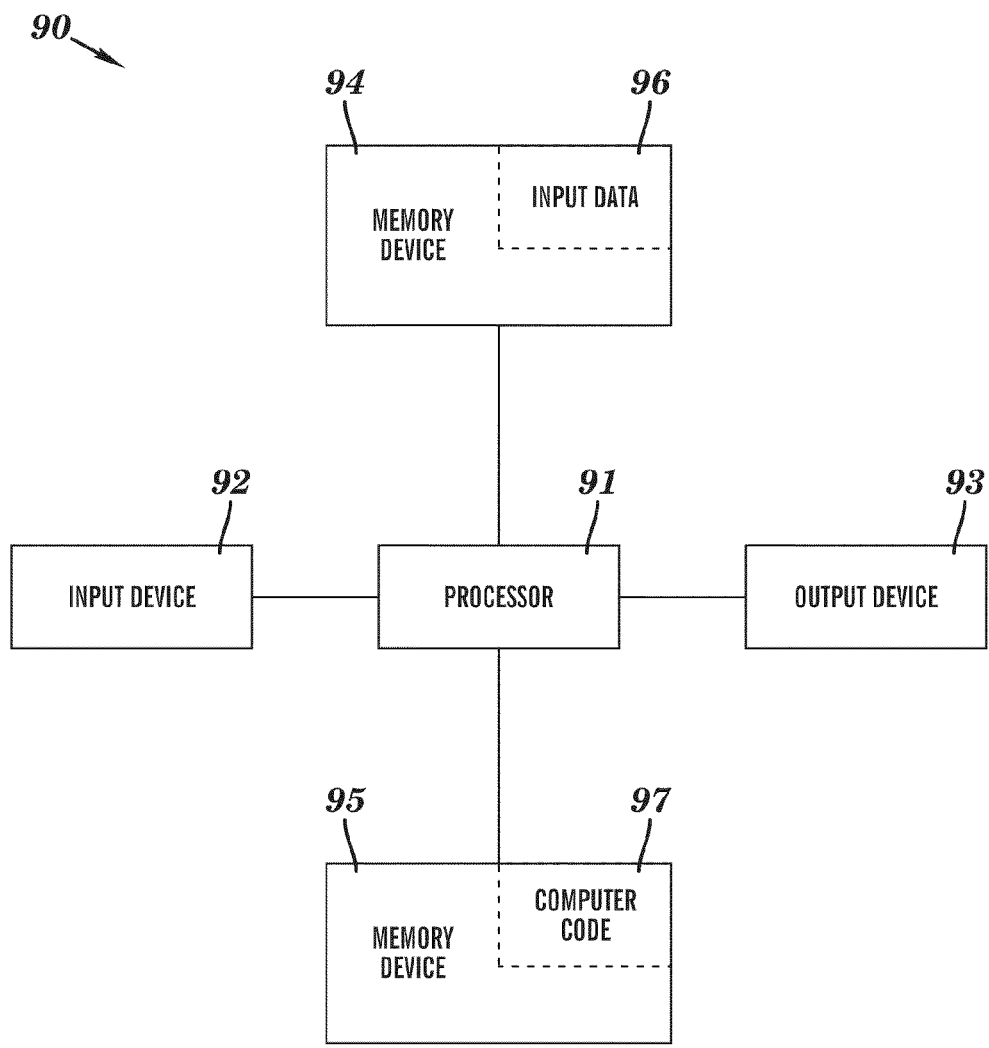
FIG. 16 illustrates a computer system used for executing software to implement the methodology of the present invention.

FIG. 16 illustrates a computer system 90 used for executing software to implement the methodology of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be at least one of, inter alia, a printer, a plotter, a computer screen, a magnetic tape, a removable hard disk, a floppy disk, etc. The memory devices 94 and 95 may be at least one of, inter alia, a hard disk, a floppy disk, a magnetic tape, an optical storage such as a compact disc (CD) or a digital video disc (DVD), a random access memory (RAM), a dynamic random access memory (DRAM), a read-only memory (ROM), etc. The memory device 95 includes a computer code 97. The computer code 97 comprises software to implement the methodology of the present invention. The processor 91 executes the computer code 97. The memory device 94 includes input data 96. The input data 96 includes input required by the computer code 97. The output device 93 stores or displays output from the computer code 97. Either or both memory devices 94 and 95 (or one or more additional memory devices not shown in FIG. 16) may be used as a computer usable storage medium (or a computer readable storage medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable storage medium (or said program storage device).

In one embodiment, an apparatus of the present invention comprises the computer program product. In one embodiment, an apparatus of the present invention comprises the computer system such that the computer system comprises the computer program product.

While FIG. 16 shows the computer system 90 as a particular configuration of hardware and software, any configuration of hardware and software, as would be known to a person of ordinary skill in the art, may be utilized for the purposes stated supra in conjunction with the particular computer system 90 of FIG. 16. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for designing an electro-optical modulator device to operate in a coupling mode or a detection mode in which light having a wavelength $\lambda$ is incident upon a semiconductor structure comprised by the electro-optical modulator device at an incident angle ($\theta_i$) with respect to a direction opposite to a Z direction, said method comprising:

receiving input, by a processor of a computer system, for designing the electro-optical modulator device to operate in the coupling mode or the detection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change $\Delta a$ of an absorption coefficient (a) and a change $\Delta n$ of an index of refraction of a semiconductor domain comprising each notch and its corresponding channel region to generate a changed absorption coefficient and a changed index of refraction of the semiconductor domain, wherein $\theta_i$ is within a range defined by $\theta_{i,min} \leq \theta_i \leq \theta_{i,min}$, wherein V is within a range defined by $V_{min} \leq V \leq V_{max}$, and wherein said receiving input comprises receiving a value of $\lambda$, r, $h_g$, $\theta_{i,min}$, $\theta_{i,max}$, $V_{min}$, and $V_{max}$, an absorption coefficient threshold ($A_{th1}$), an index of refraction threshold ($n_{th1}$), acceptance criteria, and performance criteria;

said processor ascertaining P solution sets at which the electro-optical modulator device operates in an ON state in which $V=V_1$ for causing the changed absorption coefficient to exceed $A_{th1}$ and causing the changed index of refraction to exceed $n_{th1}$ and at which the acceptance criteria are satisfied, wherein said ascertaining comprises calculating $\Delta a$ according to $\Delta a(V)$ and calculating $\Delta n$ according to $\Delta n(V)$, wherein $\Delta a(V)$ is a specified function of V and $\Delta n(V)$ is a specified function of V, wherein each solution set of the P solution sets comprises $p_1$, $w_1$, $\theta_i$, and $V_1$, and wherein $P \geq 1$;

if P=1 such that the P solution sets consist of a single solution set, then said processor determining a design set for the ON state as being the single solution set;

if P>1, then said processor computing a performance count with respect to the performance criteria for each solution set and determining the design set for the ON state as being a solution set of the P solution sets having the highest computed performance count;

said processor transmitting the design set for the ON state to an output device.

2. The method of claim 1, wherein said receiving input comprises receiving a value of an absorption coefficient threshold ($A_{th0}$) and an index of refraction threshold ($n_{th0}$), wherein the method further comprises determining that the electro-optical modulator device is switchable from the ON state to an OFF state and from the OFF state to the ON state by setting the applied voltage V to $V_1$ for the ON state and to $V_0$ for the OFF state, wherein $V_0$ causes the absorption coefficient of the semiconductor domain to be less than $A_{th0}$ and the index of refraction of the semiconductor domain to be less than $n_{th0}$, which defines a design combination of $p_1$, $w_1$, $\theta_i$, and $V_0$ for the OFF state, wherein $A_{th0} < A_{th1}$ and $n_{th0} < n_{th1}$, wherein $p_1$, $w_1$, and $\theta_i$ have same values for the OFF state and the ON state, and wherein the method further comprises determining $V_0$ and transmitting $V_0$ to the output device.

3. The method of claim 2, wherein said receiving input comprises receiving input for designing the electro-optical modulator device to operate in the coupling mode, wherein the semiconductor structure comprises a passivation layer on both the grating structure and portions of the semiconductor layer and comprising an electrically insulating material and having an index of refraction $n_1$, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region is an undoped semiconductor material, wherein the method further comprises constraining each solution set of the P solution sets to satisfy $p_1 = \lambda/(n_2 \sin \theta_{p1} - n_1 \sin \theta_i)$, wherein $\theta_{p1}$ is a propagation angle for a propagation component of the light in the X direction inside the semiconductor layer, and wherein $n_2$ is an index of refraction of the semiconductor layer.

4. The method of claim 3, wherein the grating structures are further distributed in a periodic pattern having a pitch ($p_2$) in a Y direction that is orthogonal to both the X direction and the Z direction, wherein each notch comprises a width ($w_2$) in the Y direction, wherein each solution set of the P solution sets further comprises $p_2$ and $w_2$, and wherein the method further comprises constraining each solution set of the P solution sets to satisfy $p_1 = \lambda/(n_2 \sin \theta_{p1} - n_1 \sin \theta_i)$ and $p_2 = \lambda/(n_2 \sin \theta_{p2} - n_1 \sin \theta_i)$, and wherein $\theta_{p2}$ is a propagation angle for a propagation component of the light in the Y direction.

5. The method of claim 3, wherein the electro-optical modulator device comprises a waveguide coupled to the semiconductor structure, and wherein the method further comprises constraining each solution set of the P solution sets to satisfy $w_1/h_w \leq r/(1-r^2)^{1/2}$ such that $h_w = h_g + r$.

6. The method of claim 2, wherein said receiving input comprises receiving input for designing the electro-optical modulator device to operate in the detection mode, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region is a P− doped or N− doped intrinsic semiconductor region (I region) which in combination with N+ and P+ doped semiconductor regions between which each I region is disposed forms a PIN structure, and wherein operation of the electro-optical modulator device in the ON state generates a detectable photo current in the PIN structure and operation of the electro-optical modulator device in the OFF state does not generate the detectable photo current in the PIN structure.

7. The method of claim 6, wherein the grating structures are further distributed in a periodic pattern having a pitch ($p_2$) in a Y direction that is orthogonal to both the X direction and the Z direction, wherein each notch comprises a maximum width ($w_2$) in the Y direction, wherein each solution set of the P solution sets further comprises $p_2$ and $w_2$, wherein the voltage V is applied between an anode or cathode at each notch and a cathode or anode, respectively, at the corresponding doped semiconductor region in the semiconductor layer, where each cathode is displaced from an adjacent anode by a gap d in the Y direction, and wherein said receiving input further comprises receiving a value of d.

8. The method of claim 1, wherein the semiconductor structure further comprises a bulk semiconductor substrate that includes a first semiconductor material, a buried oxide layer on the substrate and comprising a first electrically insulative material and having an index of refraction $n_3$, and a passivation layer on and in direct mechanical contact with both the grating structure and portions of the semiconductor layer and comprising a second electrically insulating material and having an index of refraction $n_1$, wherein the semiconductor layer is on and in direct mechanical contact with the buried oxide layer and has an index of refraction $n_2$, wherein the grating structures are in direct mechanical contact with the top surface of the semiconductor layer, wherein $n_2 > n_3$ and $n_2 > n_1$, wherein the semiconductor layer further comprises a plurality of doped semiconductor regions in an alternating sequence of channel regions in which each channel region comprises a second semiconductor material and is disposed between and in direct mechanical contact with a N+ doped semiconductor region of the plurality of doped semiconductor regions and a P+ doped semiconductor region of the plurality of doped semiconductor regions, wherein each grating structure further comprises a gate insulator disposed between and in direct mechanical contact with the notch and a corresponding channel region of the plurality of channel regions, and wherein the notch comprises a third semiconductor material.

9. An apparatus comprising a computer program product, said computer program product comprising a computer readable memory device having a computer readable program code embodied therein, said computer readable program code containing instructions configured to be executed by a processor of a computer system to implement a method for designing an electro-optical modulator device to operate in a coupling mode or a detection mode in which light having a wavelength $\lambda$ is incident upon a semiconductor structure comprised by the electro-optical modulator device at an incident angle ($\theta_i$) with respect to a direction opposite to a Z direction, said method comprising said processor receiving input for designing the electro-optical modulator device to operate in the coupling mode or the detection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change $\Delta a$ of an absorption coefficient (a) and a change $\Delta n$ of an index of refraction of a semiconductor domain comprising each notch and its corresponding channel region to generate a changed absorption coefficient and a changed index of refraction of the semiconductor domain, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of $\lambda$, r, $h_g$, $\theta_{i,min}$, $\theta_{i,max}$, $V_{min}$, and $V_{max}$, an absorption coefficient threshold ($A_{th1}$), an index of refraction threshold ($n_{th1}$), acceptance criteria, and performance criteria;

said processor ascertaining P solution sets at which the electro-optical modulator device operates in an ON state in which $V = V_1$ for causing the changed absorption coefficient to exceed $A_{th1}$ and causing the changed index of refraction to exceed $n_{th1}$ and at which the acceptance criteria are satisfied, wherein said ascertaining comprises calculating $\Delta a$ according to $\Delta a(V)$ and calculating $\Delta n$ according to $\Delta n(V)$, wherein $\Delta a(V)$ is a specified function of V and $\Delta n(V)$ is a specified function of V, wherein each solution set of the P solution sets comprises $p_1$, $w_1$, $\theta_i$, and $V_1$, and wherein $P \geq 1$;

if P=1 such that the P solution sets consist of a single solution set, then said processor determining a design set for the ON state as being the single solution set;

if P>1, then said processor computing a performance count with respect to the performance criteria for each solution set and determining the design set for the ON state as being a solution set of the P solution sets having the highest computed performance count;

said processor transmitting the design set for the ON state to an output device.

10. The apparatus of claim 9, wherein said receiving input comprises receiving a value of an absorption coefficient threshold ($A_{th0}$) and an index of refraction threshold ($n_{th0}$), wherein the method further comprises determining that the electro-optical modulator device is switchable from the ON state to an OFF state and from the OFF state to the ON state by setting the applied voltage V to $V_1$ for the ON state and to $V_0$ for the OFF state, wherein $V_0$ causes the absorption coefficient of the semiconductor domain to be less than $A_{th0}$ and the index of refraction of the semiconductor domain to be less than $n_{th0}$, which defines a design combination of $p_1$, $w_1$, $\theta_i$, and $V_0$ for the OFF state, wherein $A_{th0} < A_{th1}$ and $n_{th0} < n_{th1}$, wherein $p_1$, $w_1$, and $\theta_i$ have same values for the OFF state and the ON state, and wherein the method further comprises determining $V_0$ and transmitting $V_0$ to the output device.

11. The apparatus of claim 10, wherein said receiving input comprises receiving input for designing the electro-optical modulator device to operate in the coupling mode, wherein the semiconductor structure comprises a passivation layer on both the grating structure and portions of the semiconductor layer and comprising an electrically insulating material and having an index of refraction $n_1$, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region is an undoped semiconductor material, wherein the method further comprises constraining each solution set of the P solution sets to satisfy $p_1 = \lambda/(n_2 \sin\theta_{p1} - n_1 \sin\theta_i)$, wherein $\theta_{p1}$ is a propagation angle for a propagation component of the light in the X direction inside the semiconductor layer, and wherein $n_2$ is an index of refraction of the semiconductor layer.

12. The apparatus of claim 11, wherein the grating structures are further distributed in a periodic pattern having a pitch ($p_2$) in a Y direction that is orthogonal to both the X direction and the Z direction, wherein each notch comprises a width ($w_2$) in the Y direction, wherein each solution set of the P solution sets further comprises $p_2$ and $w_2$, and wherein the method further comprises constraining each solution set of the P solution sets to satisfy $p_1 = \lambda/(n_2 \sin\theta_{p1} - n_1 \sin\theta_i)$ and $p_2 = \lambda/(n_2 \sin\theta_{p2} - n_1 \sin\theta_i)$, and wherein $\theta_{p2}$ is a propagation angle for a propagation component of the light in the Y direction.

13. The apparatus of claim 11, wherein the electro-optical modulator device comprises a waveguide coupled to the semiconductor structure or an intrinsic waveguide within the semiconductor structure, and wherein the method further comprises constraining each solution set of the P solution sets to satisfy $w_1/h_w \leq r/(1-r^2)^{1/2}$ such that $h_w = h_g + r$.

14. The apparatus of claim 10, wherein said receiving input comprises receiving input for designing the electro-optical modulator device to operate in the detection mode, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region is a P− doped or N− doped intrinsic semiconductor region (I region) which in combination with N+ and P+ doped semiconductor regions between which each I region is disposed forms a PIN structure, and wherein operation of the electro-optical modulator device in the ON state generates a detectable photo current in the PIN structure and operation of the electro-optical modulator device in the OFF state does not generate the detectable photo current in the PIN structure.

15. The apparatus of claim 14, wherein the grating structures are further distributed in a periodic pattern having a pitch ($p_2$) in a Y direction that is orthogonal to both the X direction and the Z direction, wherein each notch comprises a maximum width ($w_2$) in the Y direction, wherein each solution set of the P solution sets further comprises $p_2$ and $w_2$, wherein the voltage V is applied between an anode or cathode at each notch and a cathode or anode, respectively, at the corresponding doped semiconductor region in the semiconductor layer, where each cathode is displaced from an adjacent anode by a gap d in the Y direction, and wherein said receiving input further comprises receiving a value of d.

16. The apparatus of claim 9, wherein the apparatus comprises the computer system, and wherein the computer system comprises the computer program product.

17. A method for designing an electro-optical modulator device to operate in a reflection mode in which light having a wavelength λ is incident upon a semiconductor structure comprised by the electro-optical modulator device at an incident angle ($\theta_i$) with respect to a direction opposite to a Z direction, said method comprising:
    receiving input, by a processor of a computer system, for designing the electro-optical modulator device to operate in the reflection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change Δa of an absorption coefficient and a change Δn of an index of refraction of a semiconductor domain comprising each notch and its corresponding channel region to generate a changed absorption coefficient (a), a changed index of refraction (n), and a change in an optical path length (ΔOPL) of the semiconductor domain, wherein ΔOPL= $(2\pi/\lambda)*\Delta n*\delta r$, wherein δr is a total physical path length of the semiconductor domain traversed by the light incident upon the semiconductor structure at the angle $\theta_i$, wherein $\theta_i$ is within a range defined by $\theta_{i,min} \leq \theta_i \leq \theta_{i,max}$, wherein V is within a range defined by $V_{min} \leq V \leq V_{max}$, and wherein said receiving input comprises receiving a value of λ, r, $h_g$, $\theta_{i,min}$, $\theta_{i,max}$, $V_{min}$, and $V_{max}$, an absorption coefficient threshold ($A_{th0}$), index of refraction thresholds ($n_{0min}$ and $n_{0max}$) such that $n_{0min} < n_{0max}$, acceptance criteria, and performance criteria;

said processor ascertaining P solution sets at which the electro-optical modulator device operates in an OFF state in which V=$V_0$ for causing ΔOPL=λ/2 to be satisfied and causing the absorption coefficient of the semiconductor domain to be less than $A_{th0}$ and causing the index of refraction of the semiconductor domain to be in a range of $n_{0min}$ to $n_{0max}$ and at which the acceptance criteria are satisfied, wherein said ascertaining comprises calculating Δn according to Δn(V) and calculating δr via geometric ray tracing of the light through the semiconductor domain for the incident angle $\theta_i$, wherein Δn(V) is a specified function of V, wherein each solution set of the P solution sets comprises $p_1$, $w_1$, $\theta_i$, and $V_0$, and wherein P≧1;

if P=1 such that the P solution sets consist of a single solution set, then said processor determining a design set for the OFF state as being the single solution set;
    if P>1, then said processor computing a performance count with respect to the performance criteria for each solution set and determining the design set for the OFF state as being a solution set of the P solution sets having the highest computed performance count;
    said processor transmitting the design set for the OFF state to an output device.

18. The method of claim 17, wherein said receiving input comprises receiving a value of an absorption coefficient threshold ($A_{th1}$) and index of refraction thresholds ($n_{1min}$ and $n_{1max}$) such that $n_{1min} < n_{1max}$, wherein the method further comprises determining that the electro-optical modulator device is switchable from the OFF state to an ON state and from the ON state to the OFF state by setting the applied voltage V to $V_0$ for the OFF state and to $V_1$ for the ON state, wherein $V_1$ causes ΔOPL=0 to be satisfied and causes the absorption coefficient to be less than $A_{th1}$ and causes the index of refraction to be in a range of $n_{1min}$ to $n_{1max}$, which defines a design combination of $p_1$, $w_1$, $\theta_i$, and $V_1$ for the ON state, wherein $p_1$, $w_1$, and $\theta_i$ have same values for the OFF state and the ON state, and wherein the method further comprises determining $V_1$ and transmitting $V_1$ to the output device.

19. The method of claim 18, wherein the semiconductor structure comprises a passivation layer on both the grating structure and portions of the semiconductor layer and comprising an electrically insulating material and having an index of refraction $n_1$, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region comprises a semiconductor material, wherein the method further comprises constraining each solution set of the P solution sets to satisfy $p_1 = \lambda / (n_2 \sin\theta_{p1} - n_1 \sin\theta_i)$, wherein $\theta_{p1}$ is a propagation angle for a propagation component of the light in the X direction inside the semiconductor layer, and wherein $n_2$ is an index of refraction of the semiconductor layer.

20. The method of claim 19, wherein the grating structures are further distributed in a periodic pattern having a pitch ($p_2$) in a Y direction that is orthogonal to both the X direction and the Z direction, wherein each notch comprises a maximum width ($w_2$) in the Y direction, and wherein each solution set of the P solution sets further comprises $p_2$ and $w_2$.

21. The method of claim 17, wherein the semiconductor structure further comprises a bulk semiconductor substrate that includes a first semiconductor material, a buried oxide layer on the substrate and comprising a first electrically insulative material and having an index of refraction $n_3$, and a passivation layer on and in direct mechanical contact with both the grating structure and portions of the semiconductor layer and comprising a second electrically insulating material and having an index of refraction $n_1$, wherein the semiconductor layer is on and in direct mechanical contact with the buried oxide layer and has an index of refraction $n_2$, wherein the grating structures are in direct mechanical contact with the top surface of the semiconductor layer, wherein $n_2 > n_3$ and $n_2 > n_1$, wherein the semiconductor layer further comprises a plurality of doped semiconductor regions in an alternating sequence of channel regions in which each channel region comprises a second semiconductor material and is disposed between and in direct mechanical contact with a N+ doped semiconductor region of the plurality of doped semiconductor regions and a P+ doped semiconductor region of the plurality of doped semiconductor regions, wherein each grating structure further comprises a gate insulator disposed between and in direct mechanical contact with the notch and a corresponding channel region of the plurality of channel regions, and wherein the notch comprises a third semiconductor material.

22. An apparatus comprising a computer program product, said computer program product comprising a computer readable memory device having a computer readable program code embodied therein, said computer readable program code containing instructions configured to be executed by a processor of a computer system to implement a method for designing an electro-optical modulator device to operate in a reflection mode in which light having a wavelength $\lambda$ is incident upon a semiconductor structure comprised by the electro-optical modulator device at an incident angle ($\theta_i$) with respect to a direction opposite to a Z direction, said method comprising:

said processor receiving input for designing the electro-optical modulator device to operate in the reflection mode, wherein the semiconductor structure comprises a semiconductor layer having a thickness (r) in the Z direction and a plurality of grating structures on a top surface of the semiconductor layer, wherein the Z direction is perpendicular to the top surface of the semiconductor layer, wherein the semiconductor layer comprises a plurality of semiconductor channel regions, wherein the grating structures are distributed in a periodic pattern having a pitch ($p_1$) in an X direction that is orthogonal to the Z direction, wherein each grating structure comprises a notch and is above a corresponding channel region of the plurality of semiconductor channel regions and has a height ($h_g$) in the Z direction above the top surface of the semiconductor layer, wherein each notch comprises a width ($w_1$) in the X direction, wherein a voltage V applied between each notch and a corresponding doped semiconductor region in the semiconductor layer induces a change $\Delta a$ of an absorption coefficient and a change $\Delta n$ of an index of refraction of a semiconductor domain comprising each notch and its corresponding channel region to generate a changed absorption coefficient (a), a changed index of refraction (n), and a change in an optical path length ($\Delta OPL$) of the semiconductor domain, wherein $\Delta OPL = (2\pi/\lambda)*\Delta n*\delta r$, wherein $\delta r$ is a total physical path length of the semiconductor domain traversed by the light incident upon the semiconductor structure at the angle $\theta_i$, wherein $\theta_i$ is within a range defined by $\theta_{i,min} \leq \theta_i < \theta_{i,max}$, wherein V is within a range defined by $V_{min} \leq V \leq V_{max}$, and wherein said receiving input comprises receiving a value of $\lambda$, r, $h_g$, $\theta_{i,min}$, $\theta_{i,max}$, $V_{min}$, and $V_{max}$, an absorption coefficient threshold ($\theta_{th0}$), index of refraction thresholds ($n_{0min}$ and $n_{0max}$) such that $n_{0min} < n_{0max}$, acceptance criteria, and performance criteria;

said processor ascertaining P solution sets at which the electro-optical modulator device operates in an OFF state in which $V=V_0$ for causing $\Delta OPL=\lambda/2$ to be satisfied and causing the absorption coefficient of the semiconductor domain to be less than $A_{th0}$ and causing the index of refraction of the semiconductor domain to be in a range of $n_{0min}$ to $n_{0max}$ and at which the acceptance criteria are satisfied, wherein said ascertaining comprises calculating $\Delta n$ according to $\Delta n(V)$ and calculating $\delta r$ via geometric ray tracing of the light through the semiconductor domain for the incident angle $\theta_i$, wherein $\Delta n(V)$ is a specified function of V, wherein each solution set of the P solution sets comprises $p_1$, $w_1$, $\theta_i$, and $V_0$, and wherein $P \geq 1$;

if P=1 such that the P solution sets consist of a single solution set, then said processor determining a design set for the OFF state as being the single solution set;

if P>1, then said processor computing a performance count with respect to the performance criteria for each solution set and determining the design set for the OFF state as being a solution set of the P solution sets having the highest computed performance count;

said processor transmitting the design set for the OFF state to an output device.

23. The apparatus of claim 22, wherein said receiving input comprises receiving a value of an absorption coefficient threshold ($A_{th1}$) and index of refraction thresholds ($n_{1min}$ and $n_{2max}$) such that $n_{1min} < n_{1max}$, wherein the method further comprises determining that the electro-optical modulator device is switchable from the OFF state to an ON state and from the ON state to the OFF state by setting the applied voltage V to $V_0$ for the OFF state and to $V_1$ for the ON state, wherein $V_1$ causes $\Delta OPL=0$ to be satisfied and causes the absorption coefficient to be less than $A_{th1}$ and causes the index of refraction to be in a range of $n_{1min}$ to $n_{1max}$, which defines a design combination of $p_1$, $w_1$, $\theta_i$, and $V_1$ for the ON state, wherein $p_1$, $w_1$, and $\theta_i$ have same values for the OFF state and the ON state, and wherein the method further comprises determining $V_1$ and transmitting $V_1$ to the output device.

24. The apparatus of claim 23, wherein the semiconductor structure comprises a passivation layer on both the grating structure and portions of the semiconductor layer and comprising an electrically insulating material and having an index of refraction $n_1$, wherein the semiconductor layer further comprises a plurality of doped semiconductor regions in an alternating sequence in which each channel region is disposed between a N+ doped semiconductor region of the plurality of doped semiconductor regions and a P+ doped semiconductor region of the plurality of doped semiconductor regions, wherein each channel region comprises a semiconductor material, wherein the method further comprises constraining each solution set of the P solution sets to satisfy $p_1=\lambda/(n_2 \sin\theta_{p1} - n_1 \sin\theta_i)$, wherein $\theta_{p1}$ is a propagation angle for a propagation component of the light in the X direction inside the semiconductor layer, and wherein $n_2$ is an index of refraction of the semiconductor layer.

25. The apparatus of claim 22, wherein the apparatus comprises the computer system, and wherein the computer system comprises the computer program product.

* * * * *